(12) United States Patent
Fest et al.

(10) Patent No.: US 11,495,657 B2
(45) Date of Patent: Nov. 8, 2022

(54) THIN FILM RESISTOR (TFR) FORMED IN AN INTEGRATED CIRCUIT DEVICE USING AN OXIDE CAP LAYER AS A TFR ETCH HARDMASK

(71) Applicant: Microchip Technology Incorporated, Chandler, AZ (US)

(72) Inventors: Paul Fest, Chandler, AZ (US); Jacob Williams, Gilbert, AZ (US); Josh Kaufman, Scottsdale, AZ (US); Greg Dix, Tempe, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 119 days.

(21) Appl. No.: 17/071,584

(22) Filed: Oct. 15, 2020

(65) Prior Publication Data
US 2021/0273037 A1 Sep. 2, 2021

Related U.S. Application Data

(60) Provisional application No. 62/983,821, filed on Mar. 2, 2020.

(51) Int. Cl.
*H01L 49/02* (2006.01)
(52) U.S. Cl.
CPC .................. *H01L 28/20* (2013.01)
(58) Field of Classification Search
CPC .............. H01L 28/20; H01L 27/0688
See application file for complete search history.

(56) References Cited

U.S. PATENT DOCUMENTS

| | | | | |
|---|---|---|---|---|
| 6,081,014 A | * | 6/2000 | Redford | H01C 7/006 257/904 |
| 6,171,922 B1 | * | 1/2001 | Maghsoudnia | H01L 28/24 438/669 |
| 2006/0040458 A1 | | 2/2006 | Phan et al. | 438/382 |
| 2007/0008062 A1 | * | 1/2007 | Fivas | H01C 7/006 257/E21.004 |
| 2009/0302993 A1 | * | 12/2009 | Fujiwara | H01L 28/24 338/314 |
| 2011/0128692 A1 | | 6/2011 | Gaul et al. | 361/679.31 |

(Continued)

OTHER PUBLICATIONS

International Search Report and Written Opinion, Application No. PCT/US2020/063010, 12 pages, dated Feb. 22, 2021.

*Primary Examiner* — John A Bodnar
(74) *Attorney, Agent, or Firm* — Slayden Grubert Beard PLLC

(57) ABSTRACT

A process is provided for forming a thin film resistor (TFR) in an integrated circuit (IC) device. A TFR film is formed and annealed over an IC structure including IC elements and IC element contacts. An oxide cap is formed over the TFR film, which acts as a hardmask during a TFR etch of the TFR film to define a TFR element, which may eliminate the use of a photomask and thereby eliminate post-etch removal of photomask polymer. TFR edge spacers may be formed over lateral edges of the TFR element to insulate such TFR element edges. TFR contact openings are etched in the oxide cap over the TFR element, and a metal layer is formed over the IC structure and extending into the TFR contact openings to form metal contacts to the IC element contacts and the TFR element.

17 Claims, 41 Drawing Sheets

(56) References Cited

U.S. PATENT DOCUMENTS

2015/0187632 A1\* 7/2015 Ali .................... H01L 21/7681
  438/384
2019/0229062 A1\* 7/2019 Shin .................... H01L 28/20
2019/0392967 A1 12/2019 Leng et al.

\* cited by examiner

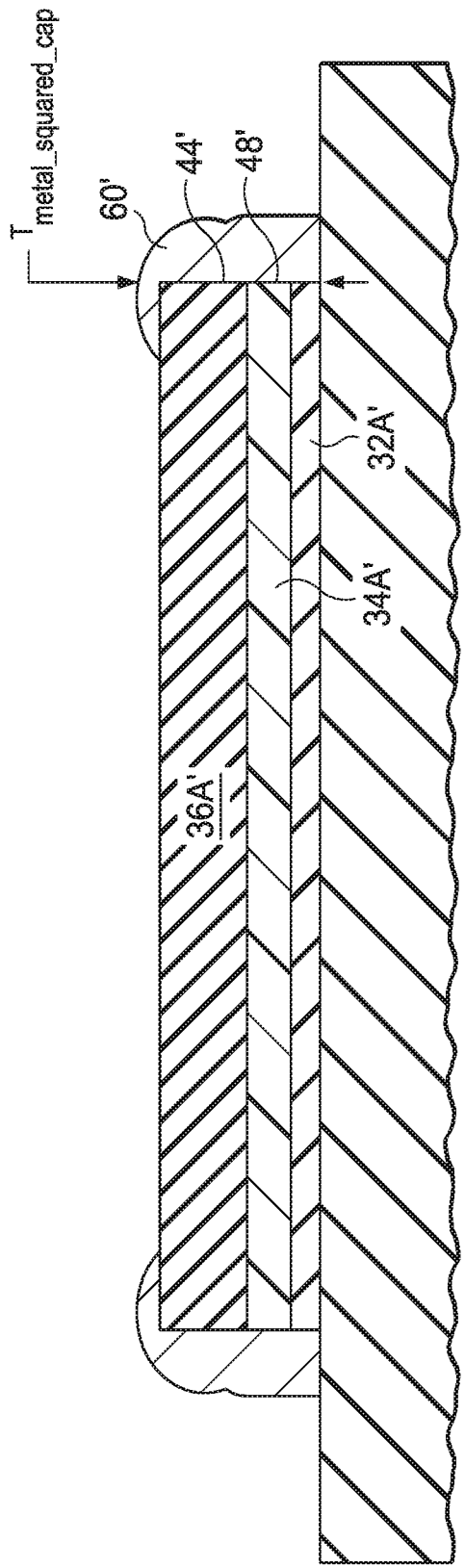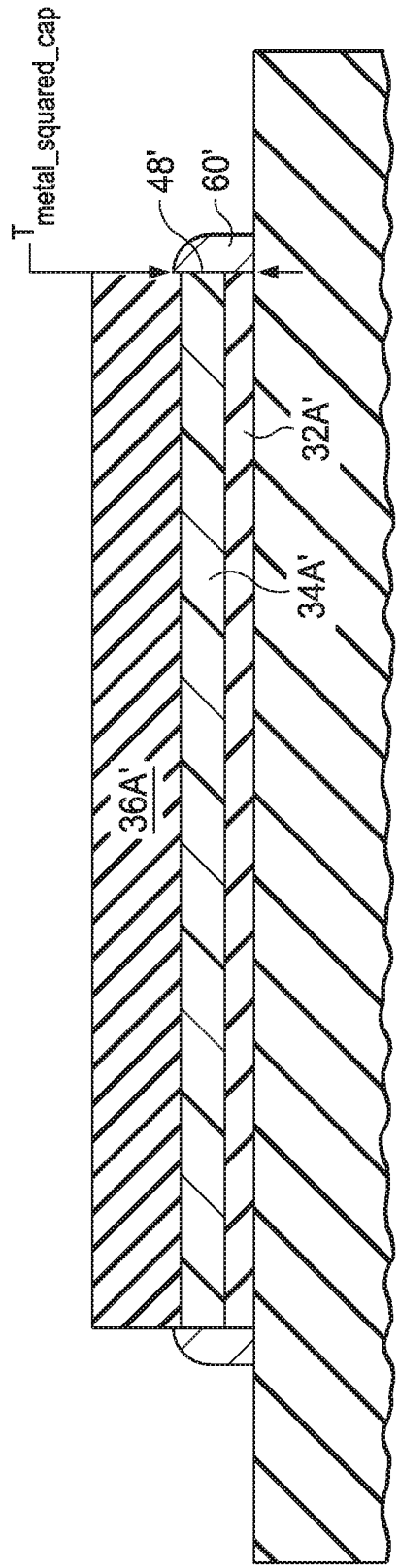

THIN FILM RESISTOR (TFR) FORMED IN AN INTEGRATED CIRCUIT DEVICE USING AN OXIDE CAP LAYER AS A TFR ETCH HARDMASK

RELATED APPLICATION

This application claims priority to commonly owned U.S. Provisional Patent Application No. 62/983,821 filed Mar. 2, 2020, the entire contents of which are hereby incorporated by reference for all purposes.

TECHNICAL FIELD

The present disclosure relates to forming thin film resistors, e.g., systems and methods for forming a thin film resistor integrated in a semiconductor integrated circuit (IC) device.

BACKGROUND

Many integrated circuit ("IC") devices incorporate thin film resistors (TFRs), which provide various advantages over other types of resistors. For example, TFRs may be highly accurate, and may be finely tuned to provide a very precise resistance value. As another example, TFRs typically have smaller parasitic components which provides advantageous high frequency behavior. In addition, TFRs typically have a low temperature coefficient of resistance (TCR), e.g., after a suitable annealing process to "tune" the TCR to a near-zero value, which may provide stable operation over a wide range of operating temperatures. A TFR anneal may be performed at above 500° C., e.g., in the range of 500-525° C., to optimize the TCR value.

A TFR may include any suitable resistive film formed on or in an insulating substrate. Some common IC-integrated TFR resistive film materials include SiCr, SiCCr, TaN, and TiN, although any other suitable materials may be used. Fabricating integrated TFRs typically requires the addition of numerous processing steps to the backend IC integration flow, such as several expensive photomask processes. It would be advantageous to reduce the number of such steps, in particular the number of photomask processes, to reduce the cost of integrated TFR fabrication.

Another problem relates to forming and annealing TFRs in IC devices that use aluminum interconnect layers (e.g., interconnect layers formed from aluminum, aluminum copper, or aluminum silicon copper), due to the relatively low melting point of aluminum. A common aluminum interconnect layer is formed as a layer stack, for example, a Ti layer, followed by a TiN layer, followed by an AlSiC layer (or AlCu or Al layer), followed by a second Ti layer, and finally a second TiN layer. A typical TFR anneal, which may involve temperatures at or above 500° C., may negatively affect such an aluminum interconnect, which has an accepted anneal temperature limit of about 450° C. For example, in an aluminum interconnect layer stack described above, when a TFR if formed and annealed (e.g., at a temperature at or above 500° C.) after forming an aluminum interconnect, $TiAl_3$ may form at grain boundaries within the interconnect layer stack, which increases sheet resistance of the interconnect (e.g., by a factor of 50 or more), which may cause electromigration problems in the IC structure.

Yet another problem with certain TFR integration processes involves the formation of heavy polymer residue from a polymer photomask used for a TFR etch, e.g., during the formation of the TFR itself. It is typically difficult to prevent or fully remove such polymer residue, as a chemical clean process to remove such polymer residue may damage sensitive structures in the area, such as IC element contacts (e.g., tungsten vias) exposed to the chemical clean.

SUMMARY

Embodiments of the present invention address various problems with conventional TFR integrations by forming a thin film resistor (TFR) after forming IC elements (e.g., memory devices) and contacts (e.g., tungsten vias), but before forming a first metal/interconnect layer, often referred to as a "Metal 1" layer. By forming the TFR prior to forming the Metal 1 layer, a TFR anneal may be performed at temperatures that would negatively affect the material of the Metal 1 layer, for example where aluminum (or other metal have a low melting temperature) is used for the Metal 1 layer. Thus, forming the TFR prior to forming the Metal 1 layer (e.g. aluminum Metal 1 layer) allows a TFR anneal at an optimal temperature (e.g., to optimize a TCR value of the TFR film), for example an anneal at or above 500° C. (e.g., in the range of 500-525° C.). Thus, embodiments of the present invention allow formation and optimal annealing of a TFR in an IC production flow that utilizes aluminum interconnect.

As used herein, "forming" any particular material layer (or other structure) may include depositing the respective material layer, growing the respective material layer (e.g., growing an oxide layer), or otherwise forming the respective material layer, and may include various process steps known in the art with respect to forming various types of layers in an IC structure.

In addition, as used herein, an "etch process" may include a single etch, or multiple etches that may include different etch chemistries or other etch parameters.

In some embodiments, the process of forming the TFR includes only two added photomasks to the background IC production flow (i.e., the IC production flow without forming the TFR).

In addition, in some embodiments the TFR integration process includes forming an oxide cap over the TFR film layer, which acts as a hardmask for a TFR etch, which can reduce or eliminate the formation of polymer during the etch, thereby eliminating the need for chemical cleans. Upper corners of the oxide cap may be rounded during the TFR etch, which may help prevent the occurrence of electrical shorts ("stringers") along the TFR element and between adjacent metal layer structures (e.g., Metal 1 layer structures).

In some embodiments, the TFR integration flow further includes forming a spacer oxide layer over the oxide cap and etching the spacer oxide layer to define "TFR oxide edge spacers" covering the lateral edges of the TFR element. These TFR oxide edge spacers may encapsulate or insulate the lateral edges of the TFR element to help ensure the TFR element is conductively connected only through the TFR contacts formed on the TFR element (e.g., aluminum contacts formed in the Metal 1 layer). Each TFR oxide edge spacer may have a rounded and/or sloped (non-vertical) outer sidewall surface, which may combine with a respective curved corner of the oxide cap to define a generally rounded and/or sloped (i.e., non-vertical) insulating structure covering the lateral edges of the TFR element, which may further reduce the occurrence of electrical shorts ("stringers") along the TFR element and between adjacent metal structures (e.g., subsequently formed Metal 1 layer structures).

In one aspect of the invention, a method is provided for forming an integrated thin film resistor (TFR) in a semiconductor integrated circuit device. An integrated circuit (IC) structure including a plurality of IC elements and a plurality of conductive IC element contacts is formed. A TFR film layer is formed over the IC structure, and annealed, e.g., to reduce a thermal coefficient of resistance (TCR) of the TFR film layer. A TFR oxide cap layer is formed over the annealed TFR film layer. A first photomask is formed and patterned over the TFR oxide cap layer, an oxide cap etch process is performed to remove selected portions of the TFR oxide cap layer to define a TFR oxide cap, the oxide cap etch process stopping at the annealed TFR film layer. The first photomask is removed, and a TFR etch process is performed, using the TFR oxide cap as a hardmask, to remove selected portions of the annealed TFR film layer to define a TFR element. A TFR contact opening etch process is performed to form at least one TFR contact opening in the TFR oxide cap, thereby exposing at least one surface area of the TFR element. A metal interconnect layer is formed over the IC structure and including (a) at least one metal interconnect element coupled to at least one of the plurality of conductive IC element contacts and (b) at least one metal interconnect extending into the at least one TFR contact opening to contact the underlying TFR element.

Using the TFR oxide cap as a hardmask during the TFR etch may avoid the need to use a photomask for the TFR etch, which may eliminate the formation of polymer residue from the photomask and thus the typical problems associated with removing such polymer residue.

In some embodiments, the method further includes forming a first etch stop layer over the IC structure prior to forming the TFR film layer; and after the TFR etch process and prior to the TFR contact opening etch process, performing an etch stop layer etch process to remove selected portions of the first etch stop layer.

In some embodiments, the oxide cap etch process rounds upper corners of the TFR oxide cap.

In some embodiments, the integrated circuit structure includes a memory cell or transistor structure including at least one conductive IC element contact connected to at least one of a source region, a drain region, and a gate region of the memory cell or transistor structure.

In some embodiments, the TFR film layer comprises silicon carbide chromium (SiCCr), silicon chromium (SiCr), chromium silicon nitride (CrSiN), tantalum nitride (TaN), tantalum silicide ($Ta_2Si$), or titanium nitride (TiN).

In some embodiments, the metal interconnect layer comprises aluminum.

In some embodiments, the TFR anneal is performed prior to depositing the metal interconnect layer.

In some embodiments, the TFR anneal comprises an anneal at a temperature of at least 500° C. For example, the TFR anneal may comprise an anneal at a temperature of 515° C.±10° C. for a duration of 15-60 minutes (e.g., 30 min).

In some embodiments, the TFR contact etch process comprises a wet etch.

In some embodiments, forming the metal interconnect layer includes forming a particular metal interconnect element defining a conductive connection between the TFR element and at least one of the plurality of conductive IC element contacts.

In another aspect of the invention, a method is provided for forming an integrated thin film resistor (TFR) in a semiconductor integrated circuit device. An integrated circuit (IC) structure including a plurality of IC elements and a plurality of conductive IC element contacts is formed. A TFR film layer is formed over the IC structure, and annealed, e.g., to reduce a thermal coefficient of resistance (TCR) of the TFR film layer. A TFR oxide cap layer is formed over the annealed TFR film layer. A first photomask is formed and patterned over the TFR oxide cap layer. An oxide cap etch process is performed to remove selected portions of the TFR oxide cap layer to define a TFR oxide cap, wherein the first etch process stops at the annealed TFR film layer, and the first photomask is removed. After the first photomask is removed, a TFR etch process is performed, using the TFR oxide cap as a hardmask, to remove selected portions of the annealed TFR film layer to define a TFR element. A spacer layer is formed over the TFR oxide cap, and a spacer etch process is performed to remove first portions of the spacer layer but leaving second portions of the spacer layer that define TFR edge spacers at lateral edges of the TFR element. A TFR contact opening etch process is performed to form at least one TFR contact opening in the TFR oxide cap, thereby exposing at least one surface area of the TFR element. A metal interconnect layer is formed over the IC structure and including (a) at least one metal interconnect element coupled to at least one of the plurality of conductive IC element contacts and (b) at least one metal interconnect extending into the at least one TFR contact opening to contact the underlying TFR element.

In some embodiments, the spacer layer comprises an oxide spacer layer. In some embodiments, the spacer layer comprises a nitride spacer layer.

In some embodiments, the method further includes forming a first etch stop layer over the IC structure prior to forming the TFR film layer, and after the spacer etch process and prior to the TFR contact opening etch process, performing an etch stop layer etch process to remove selected portions of the first etch stop layer.

In some embodiments, the method further includes forming a first etch stop layer over the IC structure prior to forming the TFR film layer, and after the oxide cap etch process and prior to forming the spacer layer, performing an etch stop layer etch process to remove selected portions of the first etch stop layer.

In some embodiments, the oxide cap etch process rounds upper corners of the TFR oxide cap.

In some embodiments, each TFR edge oxide spacer has a rounded, non-vertical outer sidewall that reduces the likelihood of electrical shorts associated with the TFR element.

In some embodiments, the integrated circuit structure includes a memory cell or transistor structure including at least one conductive IC element contact connected to at least one of a source region, a drain region, and a gate region of the memory cell or transistor structure.

In some embodiments, the TFR film layer comprises silicon carbide chromium (SiCCr), silicon chromium (SiCr), chromium silicon nitride (CrSiN), tantalum nitride (TaN), tantalum silicide ($Ta_2Si$), or titanium nitride (TiN).

In some embodiments, the metal interconnect layer comprises aluminum.

In some embodiments, the TFR anneal is performed prior to depositing the metal interconnect layer.

In some embodiments, the TFR anneal comprises an anneal at a temperature of at least 500° C. For example, the TFR anneal may comprise an anneal at a temperature of 515° C.±10° C. for a duration of 15-60 minutes (e.g., 30 min).

In some embodiments, the TFR contact etch process comprises a wet etch.

In some embodiments, forming the metal interconnect layer includes forming a particular metal interconnect element defining a conductive connection between the TFR element and at least one of the plurality of conductive IC element contacts.

In another aspect of the invention, a method is provided for forming an integrated thin film resistor (TFR) in a semiconductor integrated circuit device. An integrated circuit (IC) structure is provided, which may include a plurality of IC elements and a plurality of conductive IC element contacts connected to the plurality of IC elements. A first etch stop layer (e.g., first SiN layer) is formed over the IC structure. A TFR film layer is formed over the first etch stop layer, and annealed, e.g., to tune or optimize the TCR of the TFR film layer. A TFR oxide cap layer is formed over the TFR film layer. A first photomask is formed and patterned over a portion of the TFR oxide cap layer, and a first etch is performed to remove exposed portions of the TFR oxide cap layer to define a remaining TFR oxide cap, wherein the first etch process stops at the TFR film layer, and remaining portions of the first photomask are removed. A second etch is performed, using the TFR oxide cap as a hardmask, to remove exposed portions of the TFR film layer to define a TFR element, wherein the second etch stops at the first etch stop layer. A third etch is performed to remove exposed portions of the first etch stop layer. A second photomask is formed and patterned with at least one second mask opening aligned over the TFR element. A fourth etch is performed through the at least one second mask opening to form at least one TFR contact opening in the TFR oxide cap, thereby exposing at least one surface area of the TFR element, and remaining portions of the second photomask are removed. A metal interconnect layer is deposited extending over the plurality of conductive IC element contacts and over the TFR hardmask cap and extending into the at least one TFR contact opening in the TFR hardmask cap. A third photomask is formed and patterned, and a fourth etch is performed to remove selected portions of the metal interconnect layer to thereby define a plurality of metal interconnect elements.

In another aspect of the invention, another method is provided for forming an integrated thin film resistor (TFR) in a semiconductor integrated circuit device. An integrated circuit (IC) structure is provided, which may include a plurality of IC elements and a plurality of conductive IC element contacts connected to the plurality of IC elements. A first etch stop layer (e.g., first SiN layer) is formed over the IC structure. A TFR film layer is formed over the first etch stop layer, and annealed, e.g., to tune or optimize the TCR of the TFR film layer. A TFR oxide cap layer is formed over the TFR film layer. A first photomask is formed and patterned over a portion of the TFR oxide cap layer, a first etch is performed to remove exposed portions of the TFR oxide cap layer to define a remaining TFR oxide cap, wherein the first etch process stops at the TFR film layer, and remaining portions of the first photomask are removed. A second etch is performed, using the TFR oxide cap as a hardmask, to remove exposed portions of the TFR film layer to define a TFR element, wherein the second etch stops at the first etch stop layer. A spacer oxide layer is formed over the TFR oxide cap. A third etch is performed to remove first portions of the spacer oxide layer but leaving second portions of the spacer oxide layer defining TFR edge spacers at lateral edges of the TFR element. A fourth etch is performed to remove exposed portions of the first etch stop layer. A second photomask is formed and patterned with at least one second mask opening aligned over the TFR element. A fifth etch is performed through the at least one second mask opening to form at least one TFR contact opening in the TFR oxide cap, thereby exposing at least one surface area of the TFR element, and remaining portions of the second photomask are removed. A metal interconnect layer is deposited extending over the plurality of conductive IC element contacts and over the TFR hardmask cap and extending into the at least one TFR contact opening in the TFR hardmask cap. A third photomask is formed and patterned, and a fifth etch is performed to remove selected portions of the metal interconnect layer to thereby define a plurality of metal interconnect elements.

In one embodiment, the second etch rounds upper corners of the TFR oxide cap. In one embodiment, the TFR edge spacers have a sloped outer surface that reduces the likelihood of electrical shorts associated with the metal interconnect elements.

In another aspect of the invention, another method is provided for forming an integrated thin film resistor (TFR) in a semiconductor integrated circuit device. An integrated circuit (IC) structure is provided, which may include a plurality of IC elements and a plurality of conductive IC element contacts connected to the plurality of IC elements. A first etch stop layer (e.g., first SiN layer) is formed over the IC structure. A TFR film layer is formed over the first etch stop layer, and annealed, e.g., to tune or optimize the TCR of the TFR film layer. A TFR oxide cap layer is formed over the TFR film layer. A first photomask is formed and patterned over a portion of the TFR oxide cap layer, a first etch is performed to remove exposed portions of the TFR oxide cap layer to define a remaining TFR oxide cap, wherein the first etch process stops at the TFR film layer, and remaining portions of the first photomask are removed. A second etch is performed, using the TFR oxide cap as a hardmask, to remove exposed portions of the TFR film layer to define a TFR element. A third etch is performed, using the TFR oxide cap as a hardmask, to remove exposed portions of the first etch stop layer. A spacer oxide layer is formed over the TFR oxide cap. A fourth etch is performed to remove first portions of the spacer oxide layer but leaving second portions of the spacer oxide layer defining TFR edge spacers at lateral edges of the TFR element. A second photomask is formed and patterned with at least one second mask opening aligned over the TFR element. A fifth etch is performed through the at least one second mask opening to form at least one TFR contact opening in the TFR oxide cap, thereby exposing at least one surface area of the TFR element, and remaining portions of the second photomask are removed. A metal interconnect layer is deposited extending over the plurality of conductive IC element contacts and over the TFR hardmask cap and extending into the at least one TFR contact opening in the TFR hardmask cap. A third photomask is formed and patterned, and a fifth etch is performed to remove selected portions of the metal interconnect layer to thereby define a plurality of metal interconnect elements.

In one embodiment, the second etch rounds upper corners of the TFR oxide cap. In one embodiment, the TFR edge spacers have a sloped outer surface that reduces the likelihood of electrical shorts associated with the metal interconnect elements.

In another aspect, semiconductor IC devices including a thin film resistor (TFR) produced according to any of the disclosed processes are provided.

BRIEF DESCRIPTION OF THE DRAWINGS

Example aspects of the present disclosure are described below in conjunction with the figures, in which:

FIGS. 4A-4C and 5A-5C illustrate how rounded lateral edges of a TFR oxide cap can prevent or reduce the occurrence of electrical shorts (often referred to as "stringers") in an integrated TFR. More particularly, FIGS. 4A-4C show a removal of selected portions of a metal layer deposited over a TFR oxide cap having rounded lateral edges, while FIGS. 5A-5C show a removal of selected portions of a metal layer deposited over a TFR oxide cap having vertical ("squared-off") lateral edges.

DETAILED DESCRIPTION OF THE INVENTION

Figure 1A:
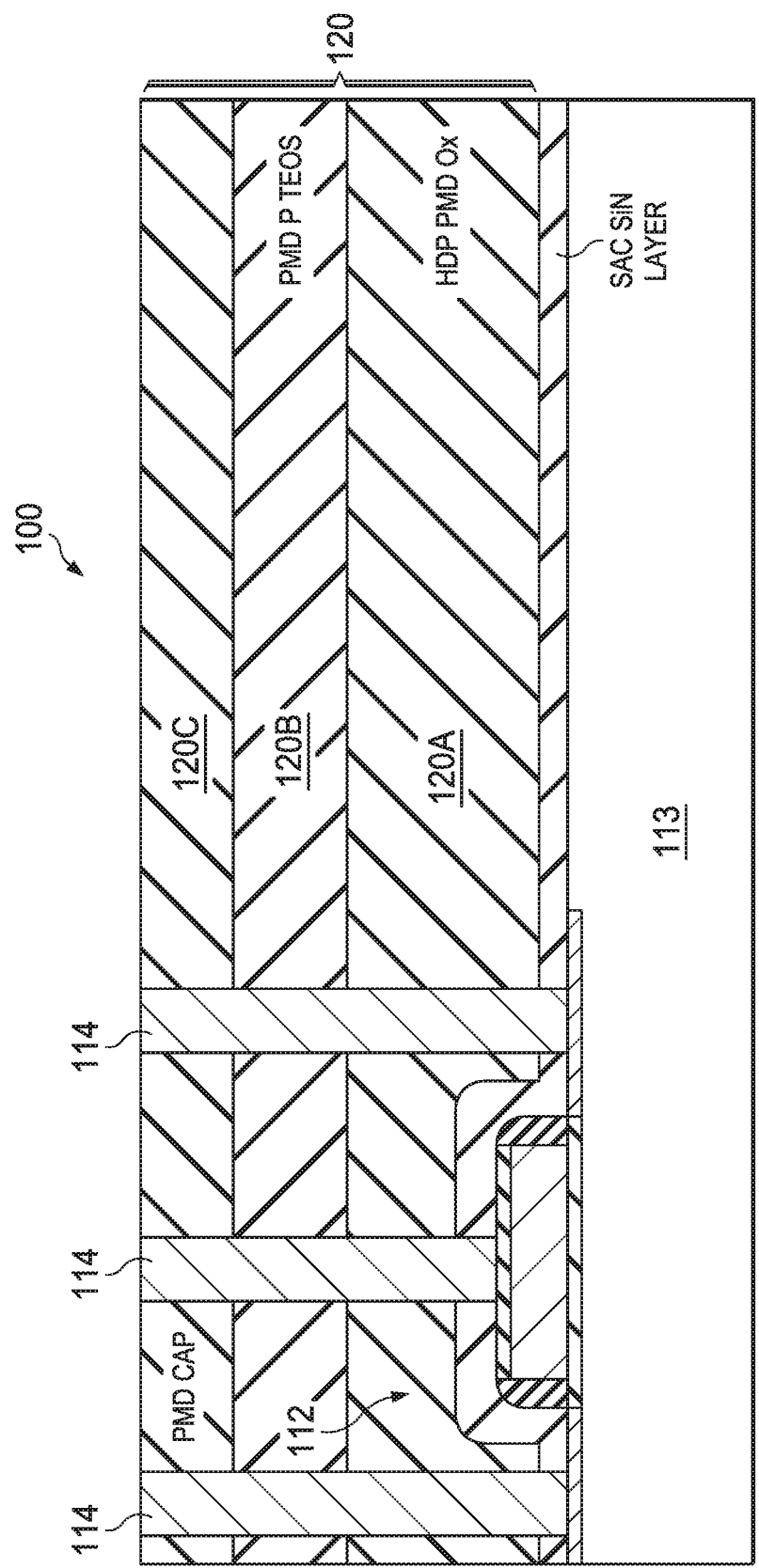
FIGS. 1A-1K illustrate steps of a first example method of integrating a thin film resistor (TFR) in a semiconductor integrated circuit (IC) device, according to a first example embodiment of the invention.

Embodiments of the present invention provide an improved technique for integrating a thin film resistor (TFR) in a semiconductor integrated circuit (IC) device, which may provide a cost reduction as compared with conventional techniques, e.g., by allowing for TFR integration in combination with aluminum interconnect. In some embodiments, the TFR is formed after IC elements and IC element contacts (e.g. tungsten vias) are formed, but before the first metal/interconnect layer ("Metal 1" layer) is formed. This may allow a TFR anneal to be performed (e.g., to optimize the TCR value of the TFR film), for example at a temperature of 500° C. or above (e.g., in the range of 500-525° C.). Thus, an annealed TFR may be integrated into an IC device that uses aluminum interconnect, because the aluminum interconnect (which is generally not tolerant of the high temperatures experienced during a typical TFR anneal) is not formed until after the TFR anneal.

Further, in some embodiments the process of forming the integrated TFR adds only two additional photomasks to the baseline IC production flow. In some embodiments, the TFR formation process includes forming a TFR etch stop layer (e.g., SiN layer) over the IC structure (and under the TFR element), which protects underlying IC elements (e.g., memory elements and tungsten contacts) during various process steps.

In addition, in some embodiments the TFR integration process includes forming an oxide cap over the TFR film layer, which acts as a hardmask for a TFR etch, which can reduce or eliminate the formation of polymer during the etch, thereby eliminating the need for chemical cleans. Upper corners of the oxide cap may be rounded during the TFR etch, which may help prevent the occurrence of electrical shorts ("stringers") along the TFR element and between adjacent metal layer structures (e.g., Metal 1 layer structures).

In some embodiments, the TFR integration flow further includes forming a spacer oxide layer over the oxide cap and etching the spacer oxide layer to define "TFR oxide edge spacers" covering the lateral edges of the TFR element. These TFR oxide edge spacers may encapsulate or insulate the lateral edges of the TFR element to help ensure the TFR element is conductively connected only through the TFR contacts formed on the TFR element (e.g., aluminum contacts formed in the Metal 1 layer). Each TFR oxide edge spacer may have a rounded and/or sloped (non-vertical) outer sidewall surface, which may combine with a respective curved corner of the oxide cap to define a generally rounded and/or sloped (i.e., non-vertical) insulating structure covering the lateral edges of the TFR element, which may further reduce the occurrence of electrical shorts ("stringers") along the TFR element and between adjacent metal structures (e.g., subsequently formed Metal 1 layer structures).

FIGS. 1A-1M illustrate a first example method of integrating a thin film resistor (TFR) in a semiconductor integrated circuit (IC) device, according to a first example embodiment.

FIG. 1A illustrates an example integrated circuit (IC) structure 100, e.g., during the manufacturing of an IC device. In this example, the IC structure 100 includes a transistor structure 112 formed over a substrate 113, with a plurality of conductive contacts 114, e.g., tungsten vias, extending though a bulk insulation region 120 formed over the transistor structure 112. However, the IC structure 100 may include any other IC devices(s) or structure(s), e.g., one or more full or partial memory cells or memory cell structures, and conductive contacts associated with such structures. In this example embodiment, the bulk insulation region 120 includes (a) a high-density plasma (HDP) premetal dielectric (PMD) oxide layer 120A, (b) a PMD oxide film 120B, e.g., PMD P TEOS (phosphorous-doped tetraethyl orthosilicate film), and (c) a PMD cap layer 120C.

FIG. 1A may represent a state during an IC fabrication process after formation of tungsten vias 114 and a chemical mechanical polish (W CMP) process at the top of the structure 100.

Figure 1B:
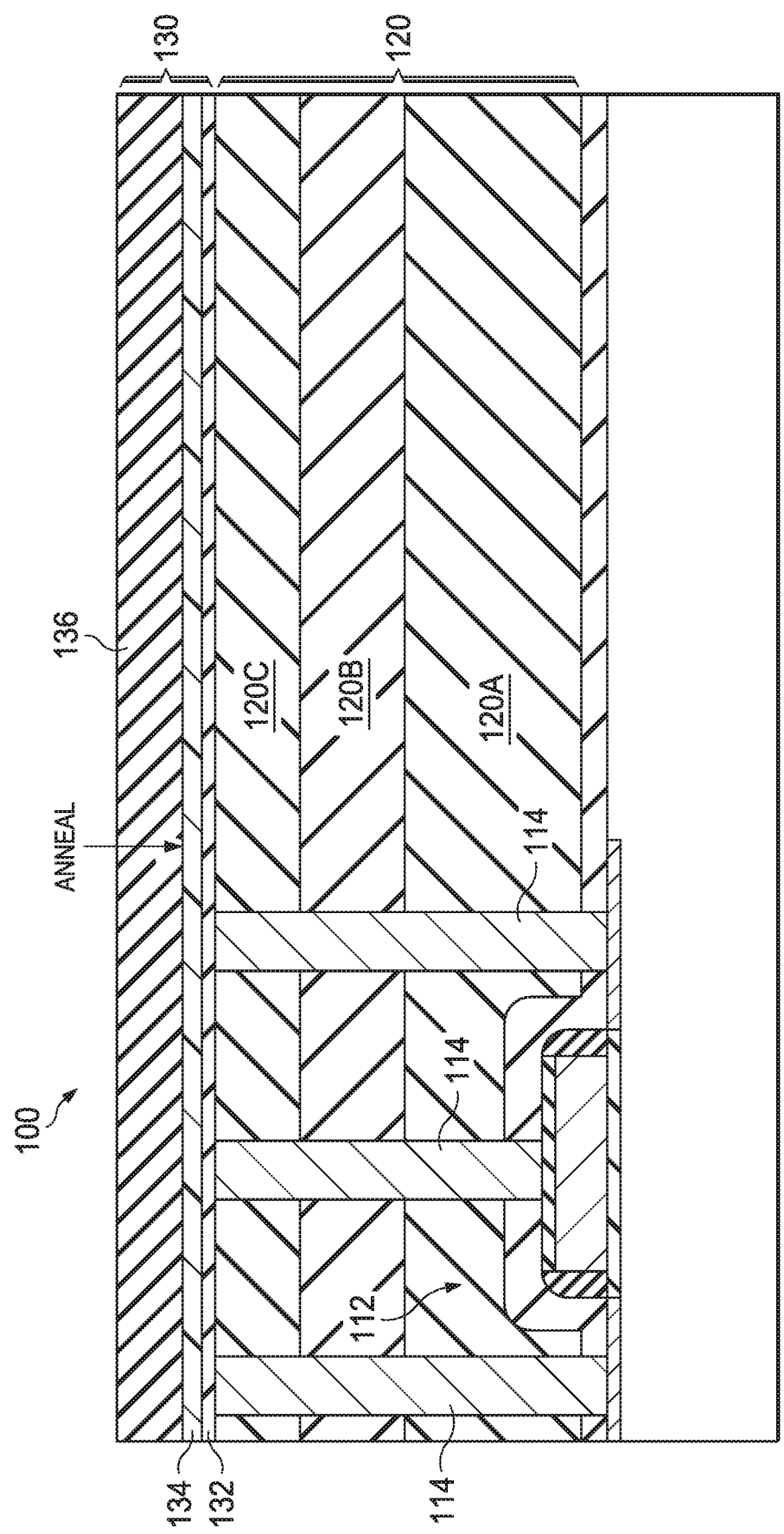

Next, as shown in FIG. 1B, a TFR layer stack 130 is formed over the bulk insulation region 120 and conductive contacts 114. First, a dielectric etch stop layer 132, e.g., a SiN layer, may be formed, e.g., to protect the tungsten vias 114 from a subsequent TFR etch shown below at FIG. 1D. A thin resistive film layer (TFR film layer) 134 may then be formed on the dielectric etch stop layer 132. The TFR film layer 134 may comprise, SiCCr, SiCr, TaN, TiN, or any other suitable TFR material.

In some embodiments, e.g., the example embodiment shown in FIGS. 1A-1K, a TFR anneal may be performed at this point, e.g., to tune or optimize a temperature coefficient of resistance (TCR) of the TFR film layer 134. For example, an anneal may be performed at a temperature of ≥500° C. In some embodiments, the TFR anneal may comprise an anneal at 515° C.±10° C. for a duration of 15-60 minutes, e.g., 30 min. In other embodiments, the TFR anneal may be performed at any other point in the process, prior to the deposition of the first metal layer/interconnect layer 160 (e.g., "Metal 1" layer) discussed below with reference to FIG. 1I. For example, in some embodiments, the TFR anneal may be performed after forming the TFR oxide cap layer 136 discussed below. In other embodiments, the TFR anneal may be performed after the TFR etching discussed below with respect to FIG. 1E. In other embodiments, the TFR anneal may be performed after completing the TFR contact etch described below with respect to FIG. 1G.

After the TFR anneal shown in FIG. 1B, a TFR oxide cap layer 136 may be formed on the TFR film layer 134. In some embodiments, the TFR oxide cap may comprise the same film as the PMD cap layer 120C below the dielectric etch stop layer 132, but may have a reduced thickness as compared with the PMD cap layer 120C.

Figure 1C:
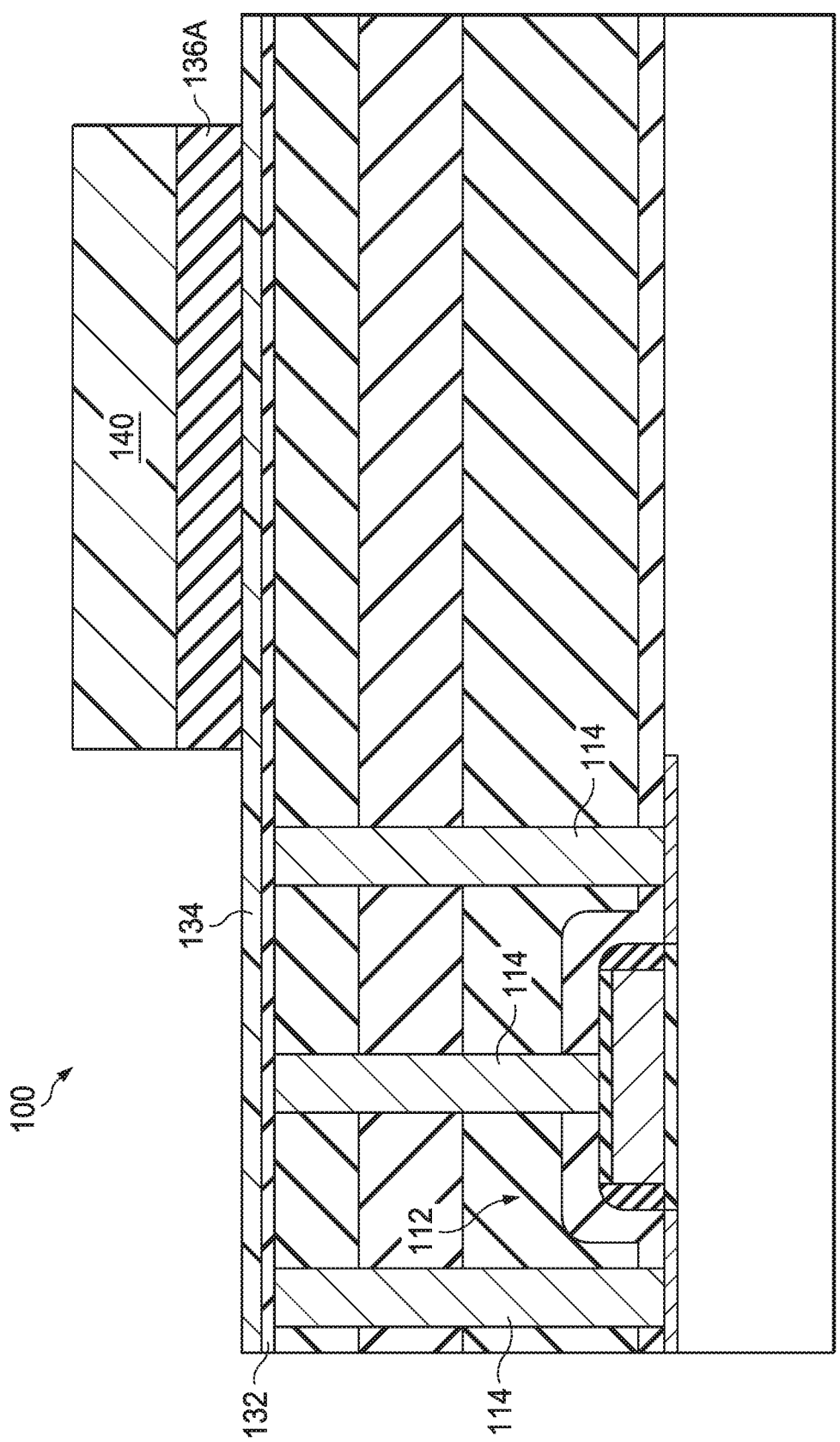

As shown in FIG. 1C, a first photomask 140 may be formed and patterned on the TFR oxide cap layer 136 (e.g., using known photolithographic techniques), in this example at a location laterally offset from the underlying transistor structure 112, and an etch (e.g., a dry etch) may then be performed to remove exposed portions of the TFR oxide cap layer 136, and stopping on the underlying TFR film layer 134, to thereby define a TFR oxide cap 136A.

Figure 1D:
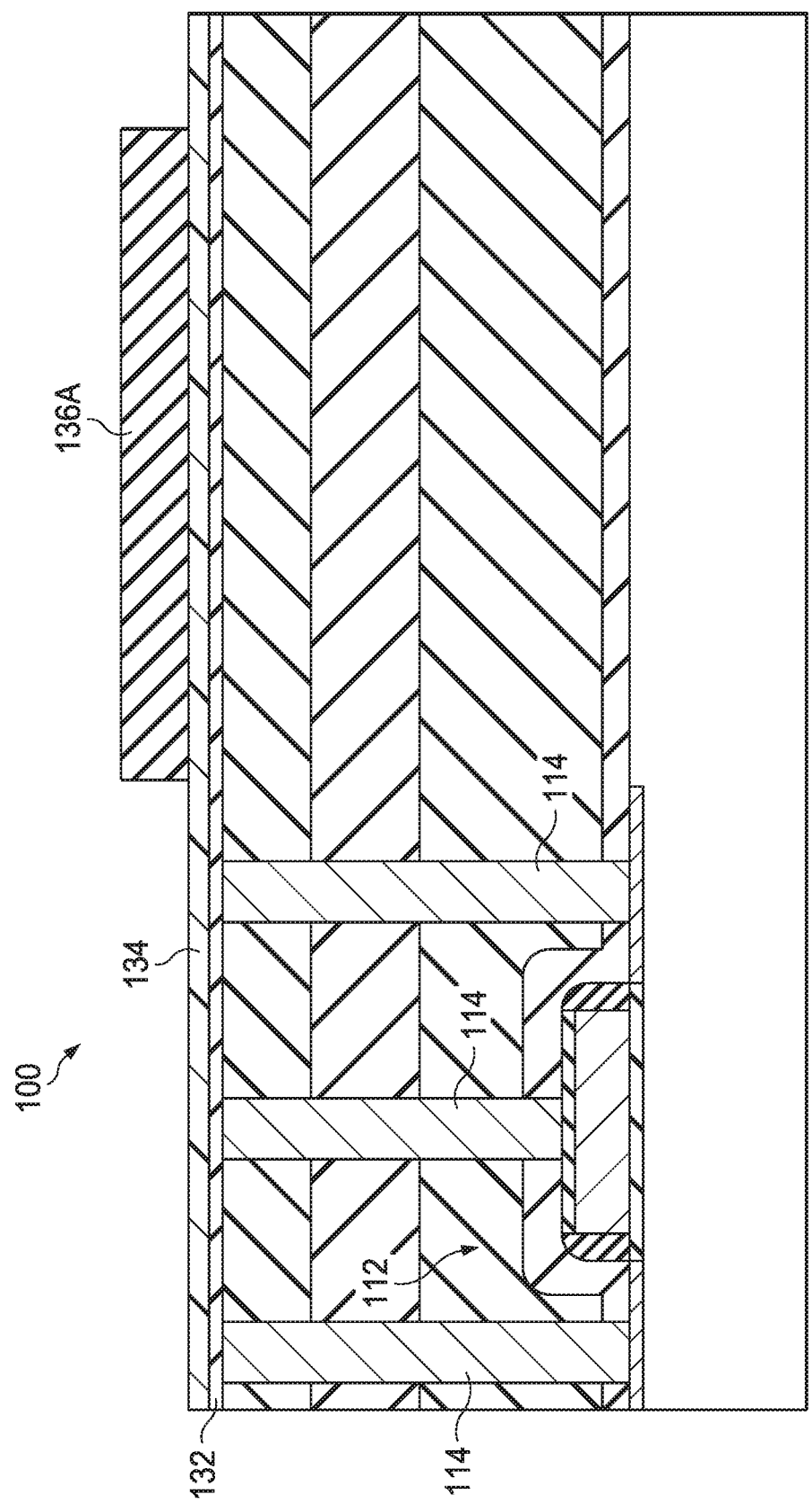

As shown in FIG. 1D, remaining portions of the photoresist 140 may be removed, e.g., using an ash resist.

Figure 1E:
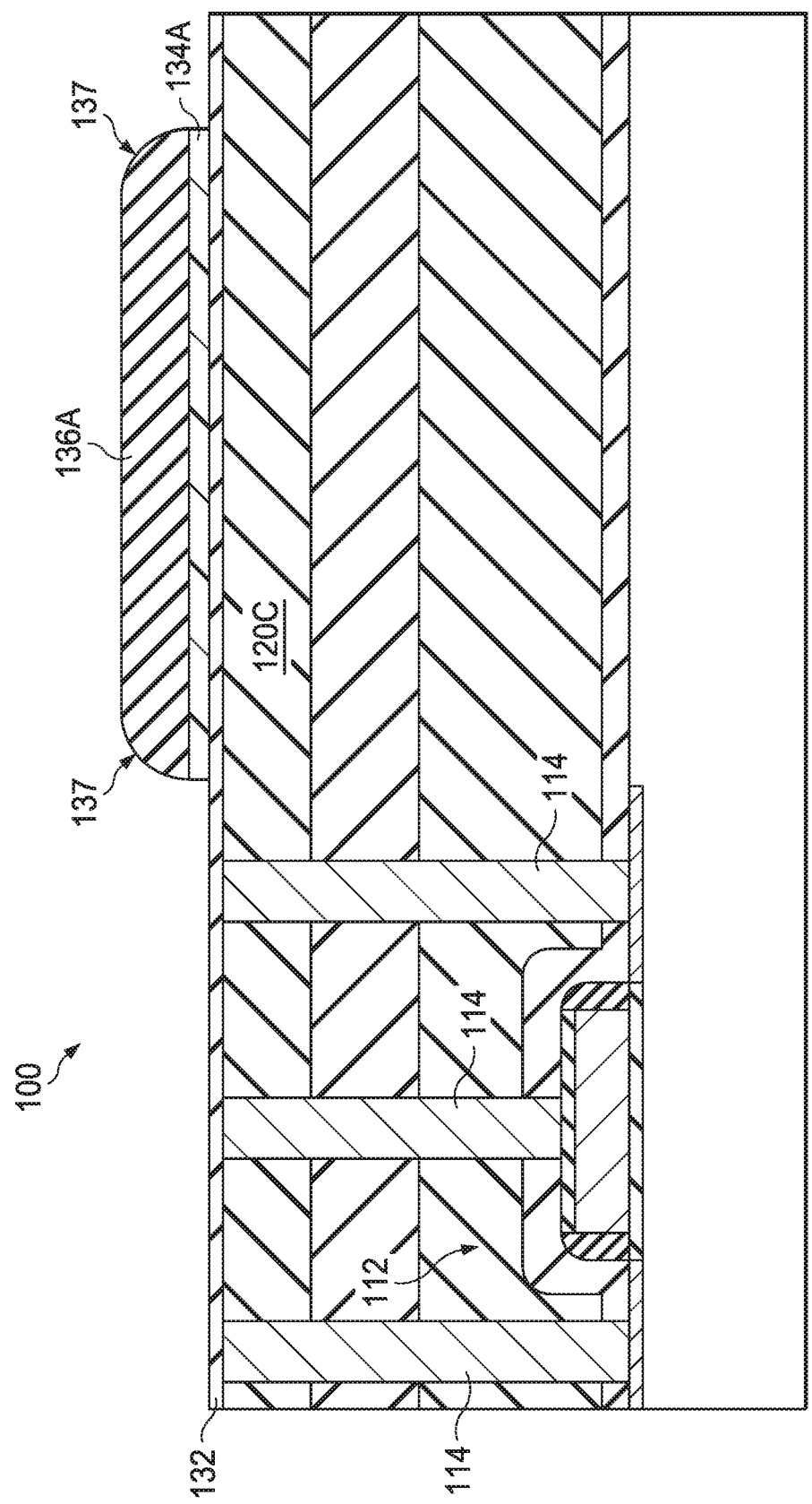

As shown in FIG. 1E, a TFR etch (e.g., a dry etch) may be performed, using the TFR oxide cap 136A as a hardmask, to remove exposed portions of the TFR film layer 134, to thereby define a TFR element 134A. As shown, the TFR film etch may round the exposed upper corners 137 of the TFR oxide cap 136A, and may stop on the dielectric etch stop layer 132 to protect the underlying structures, e.g., tungsten contacts 114. Using the TFR oxide cap 136A as a hardmask for the TFR etch avoids the need to use a photomask for this etch, which may eliminate the formation of polymer residue from the photomask and thus the typical problems associated with removing such polymer residue.

Figure 1F:
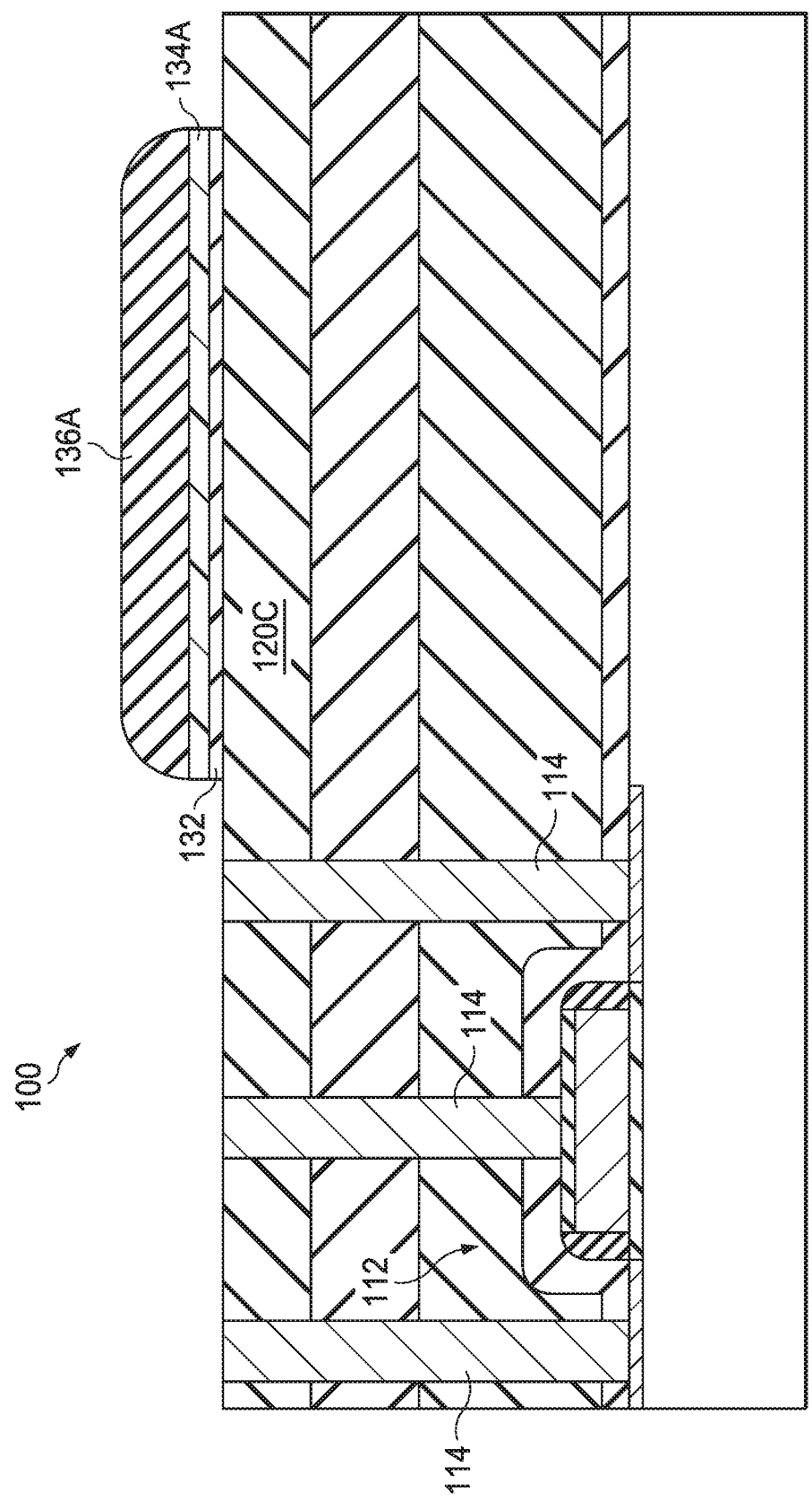

As shown in FIG. 1F, a further etch may be performed to remove exposed portions of the dielectric etch stop layer 132. In an embodiment in which dielectric etch stop layer 132 comprises a SiN layer, the etch shown in in FIG. 1F may comprise a gentle SiN clear etch with high selectivity to oxide, to protect the underlying tungsten contacts 114.

Figure 1G:
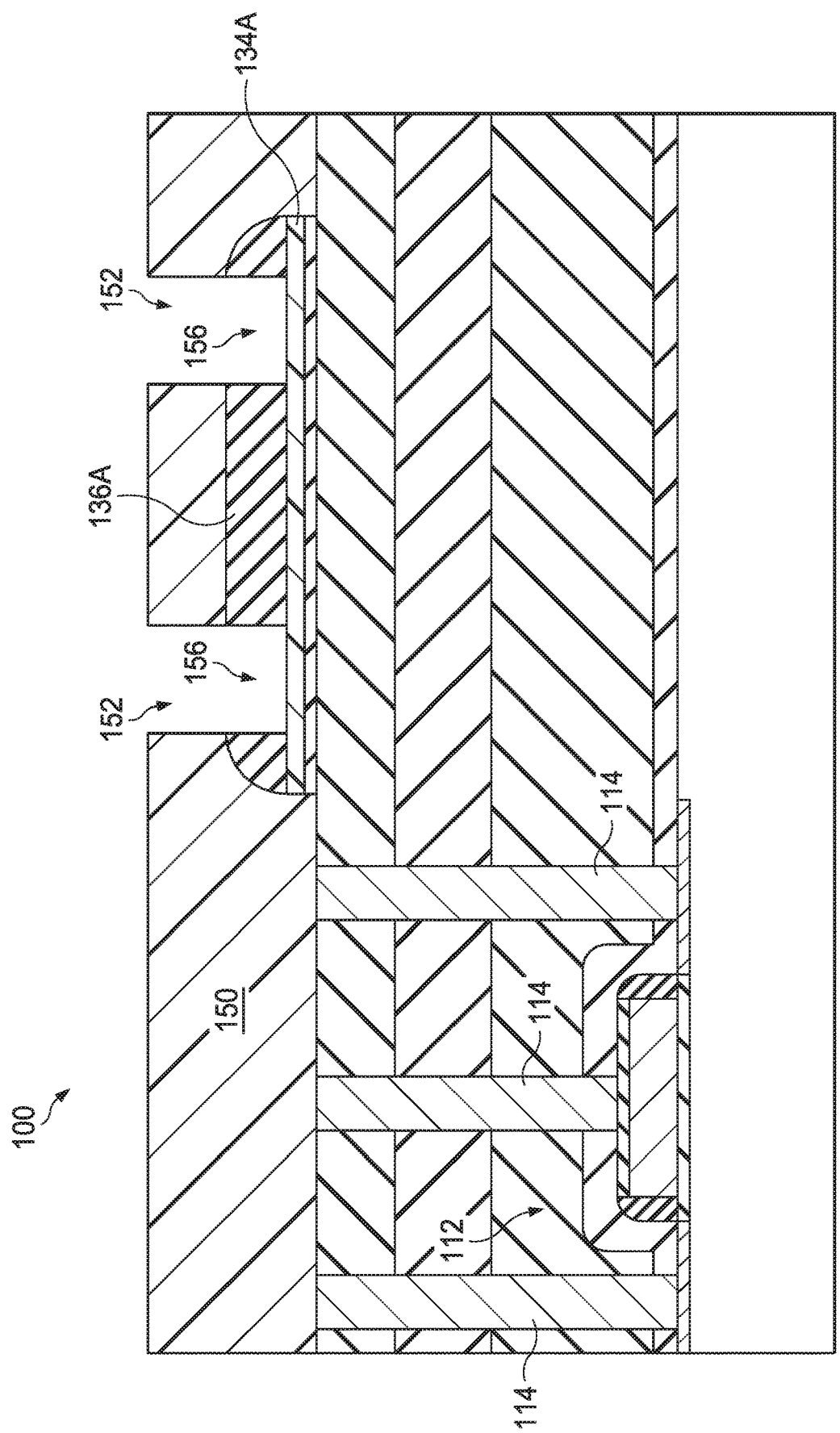

As shown in FIG. 1G, a second photomask is deposited and patterned to define a pair of mask openings aligned over the TFR element. A TFR contact etch is then performed through the mask openings 152 to define TFR contact openings 156 in the TFR oxide cap 136A, and stopping on the TFR element 134A. The TFR contact etch may be a wet etch or a dry etch. A wet etch may improve the flow of metal during a subsequent metal deposition (e.g., the Metal 1 layer deposition shown in FIG. 1I), and may reduce the occurrence of electrical shorts (often referred to as "stringers") along the TFR element 134A and between adjacent metal structures (e.g., Metal 1 layer structures).

Figure 1H:
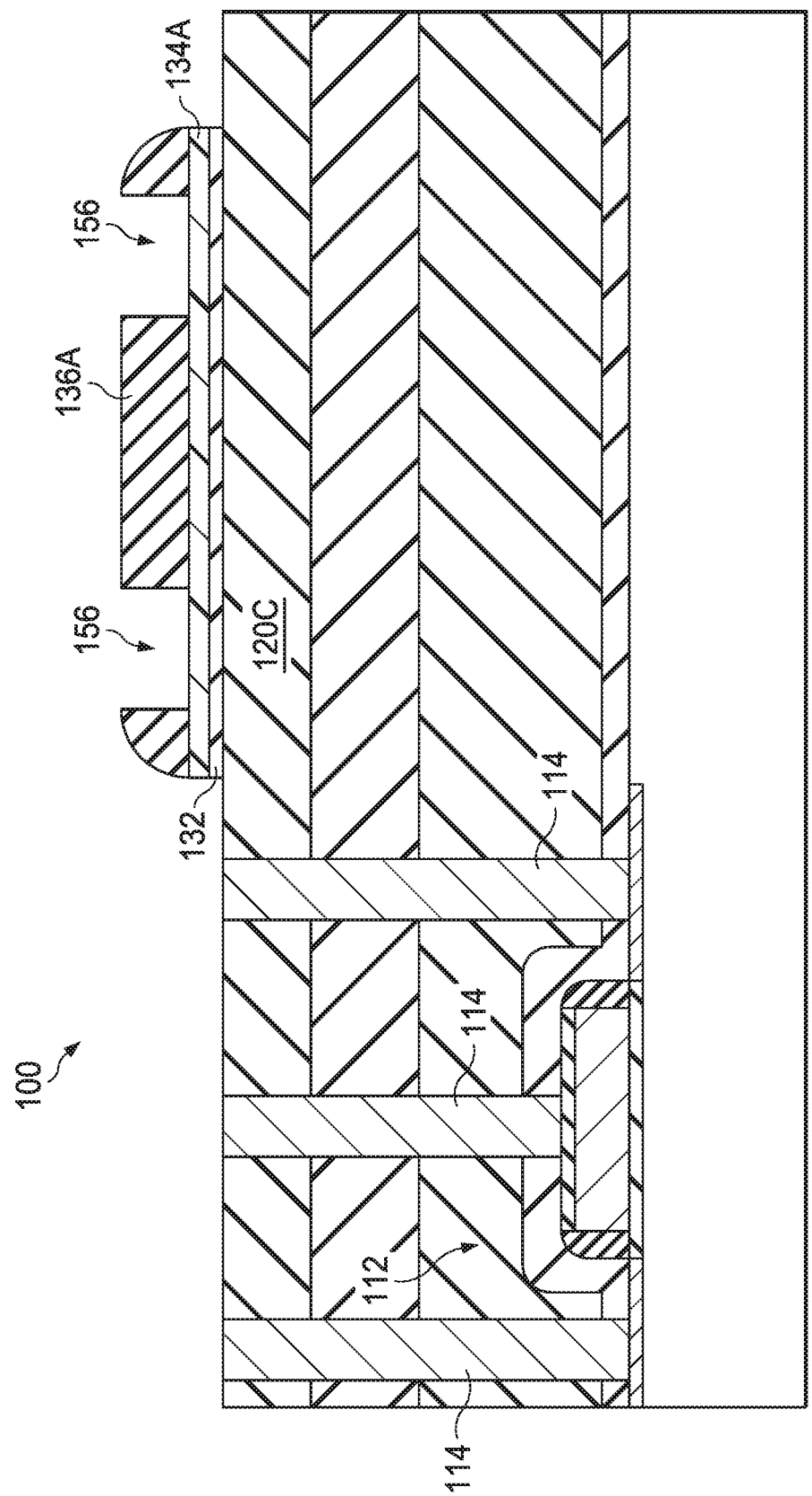

As shown in FIG. 1H, the remaining portion of the second photomask 150 may be removed, e.g., by a resist strip.

Figure 1I:
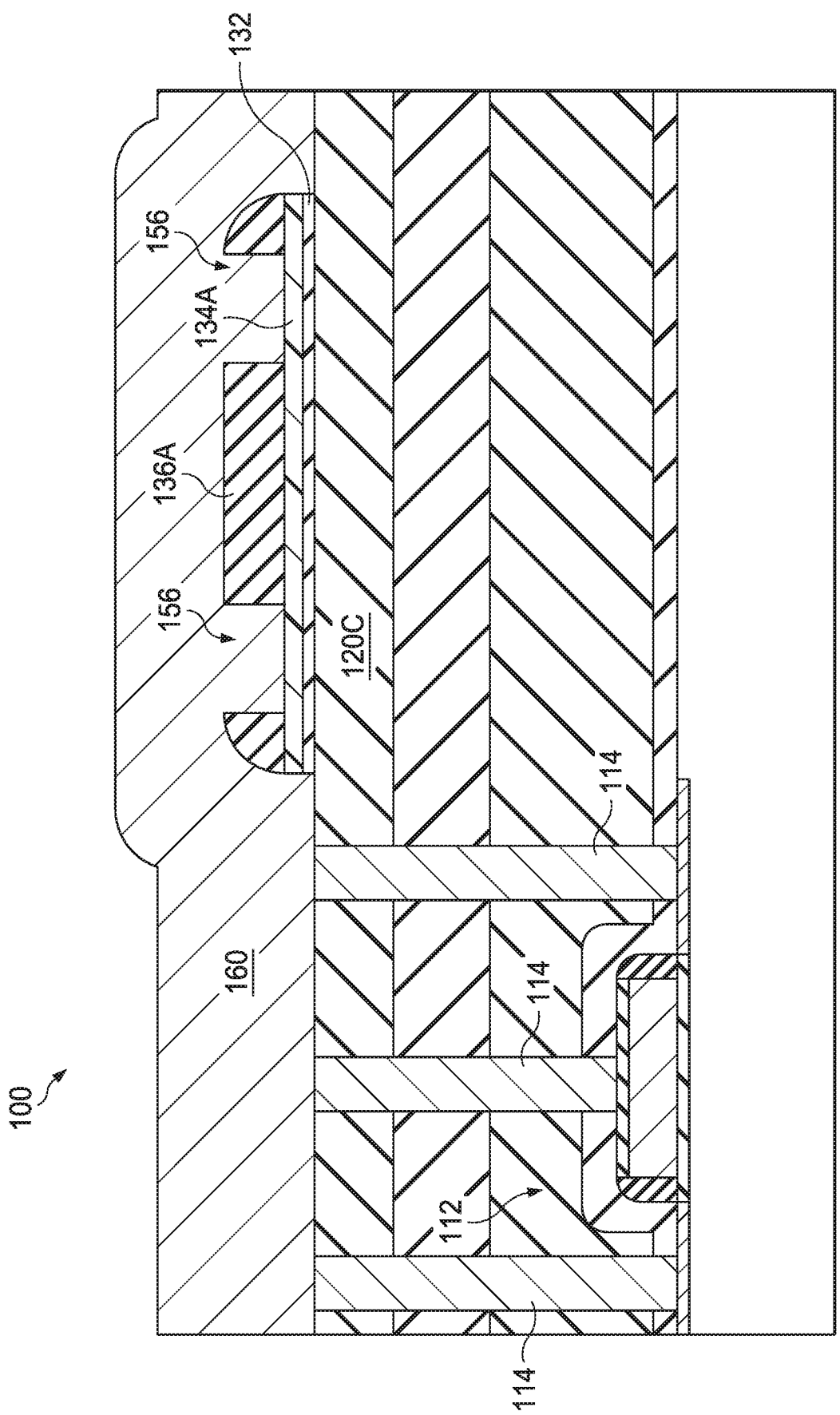

As shown in FIG. 1I, the IC device processing may continue, by forming a first metal layer/interconnect layer, referred to as a "Metal 1" layer 160. In the illustrated embodiment, Metal 1 layer 160 comprises aluminum. In other embodiments, Metal 1 layer 160 may comprise copper or other metal. As shown, Metal 1 layer 160 extends into the oxide cap openings 156 to thereby contact the TFR element 134A at opposing sides of the TFR element 134A. Metal 1 layer 160 also extends over and in contact with tungsten contacts 114.

Figure 1J:
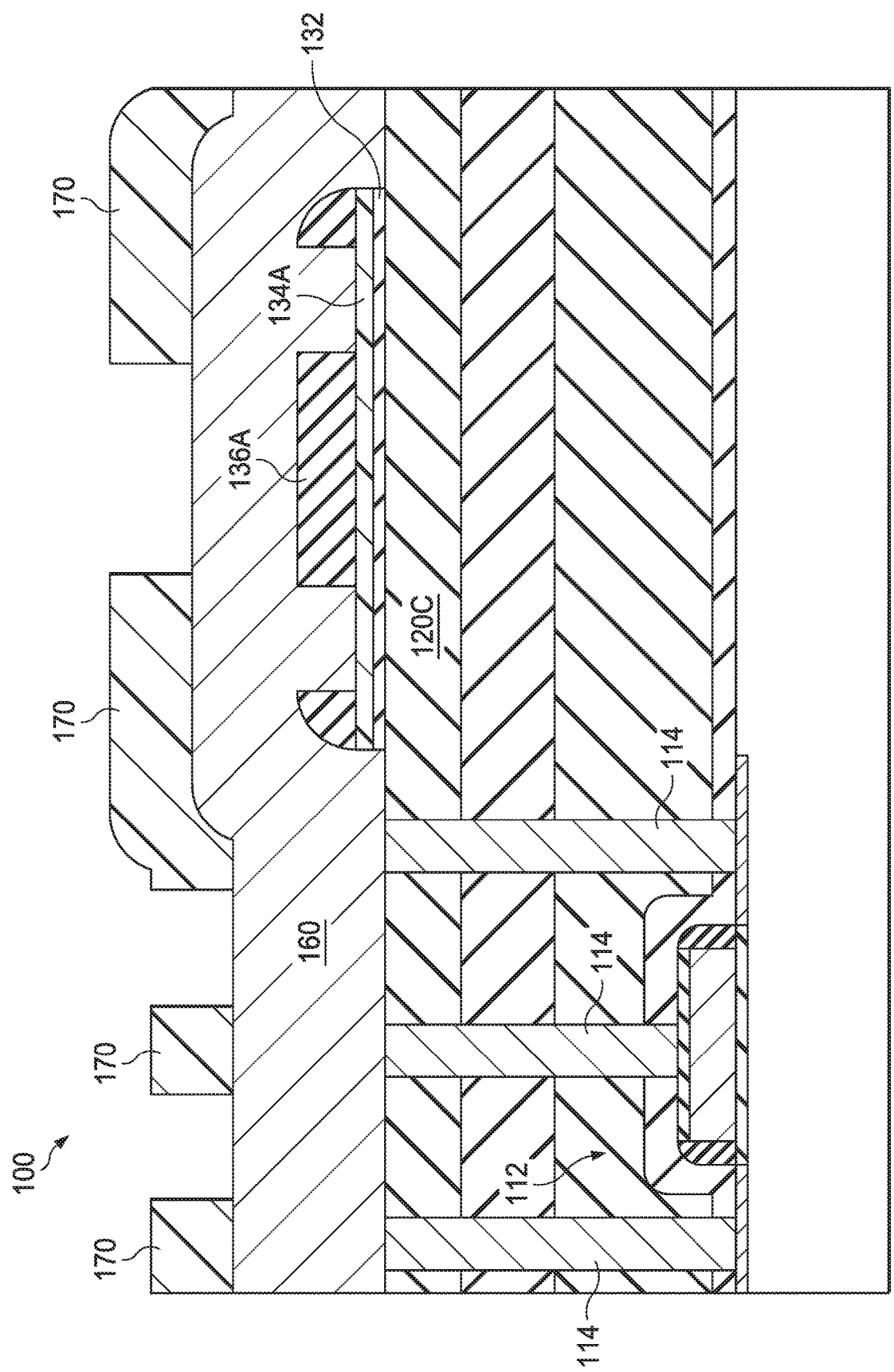

Next, as shown in FIG. 1J, a third photomask 170 may be formed and patterned over the Metal 1 layer.

Figure 1K:
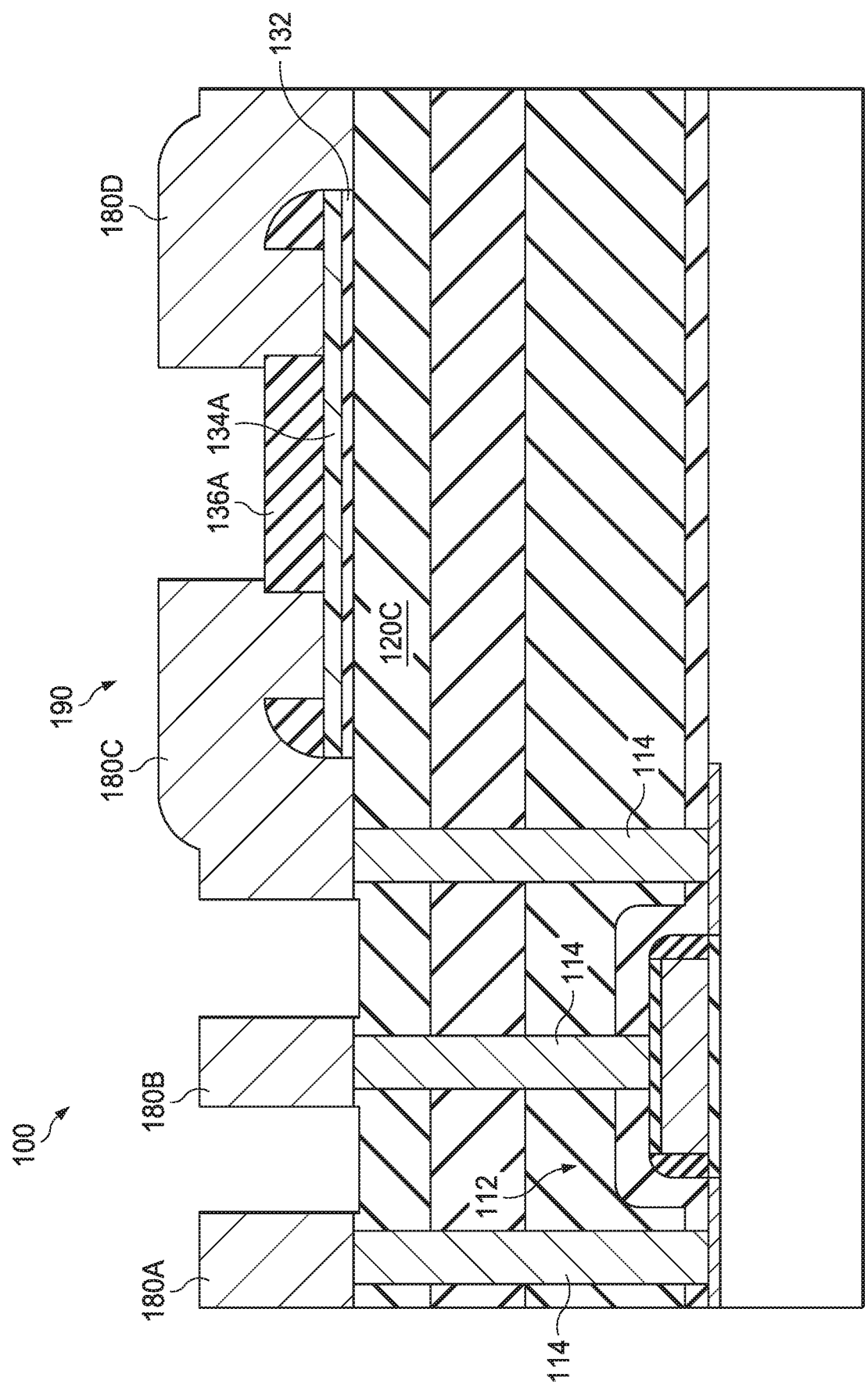

Finally, as shown in FIG. 1K, the aluminum Metal 1 layer 160 may be etched using the third photomask 170 to define a plurality of aluminum Metal 1 elements (e.g., metal interconnect elements) 180A-180D, and the remaining photoresist material 170 may then be removed. For example, as shown, the Metal 1 layer may be etched to define aluminum interconnect elements 180A and 180B in contact with tungsten vias 114, and aluminum interconnect elements 180C and 180D in contact with the opposing sides of the TFR element 134A. In this example illustration, a first aluminum interconnect element 180C conductively connects a first side of the TFR element 134A with a tungsten via 114A coupled to a source or drain region of the transistor 112, and a second interconnect element 180D conductively contacts a second side of the TFR element 134A with other IC element structure(s) (not shown). The TFR element 134A and the first and second interconnect elements 180C and 180D collectively define an integrated TFR, indicated at 190.

As discussed below, e.g., with respect to FIGS. 4A-4C and 5A-5C, the rounded upper corners 137 of the TFR oxide cap 136A may facilitate the removal of selected portions of the Metal 1 layer 160 adjacent selected lateral edges of the TFR element 134A, e.g., to further prevent electrical shorts ("stringers") in the completed device.

FIGS. 2A-2M illustrate an example method of integrating a thin film resistor (TFR) in a semiconductor integrated circuit (IC) device, according to one example embodiment.

Figure 2A:
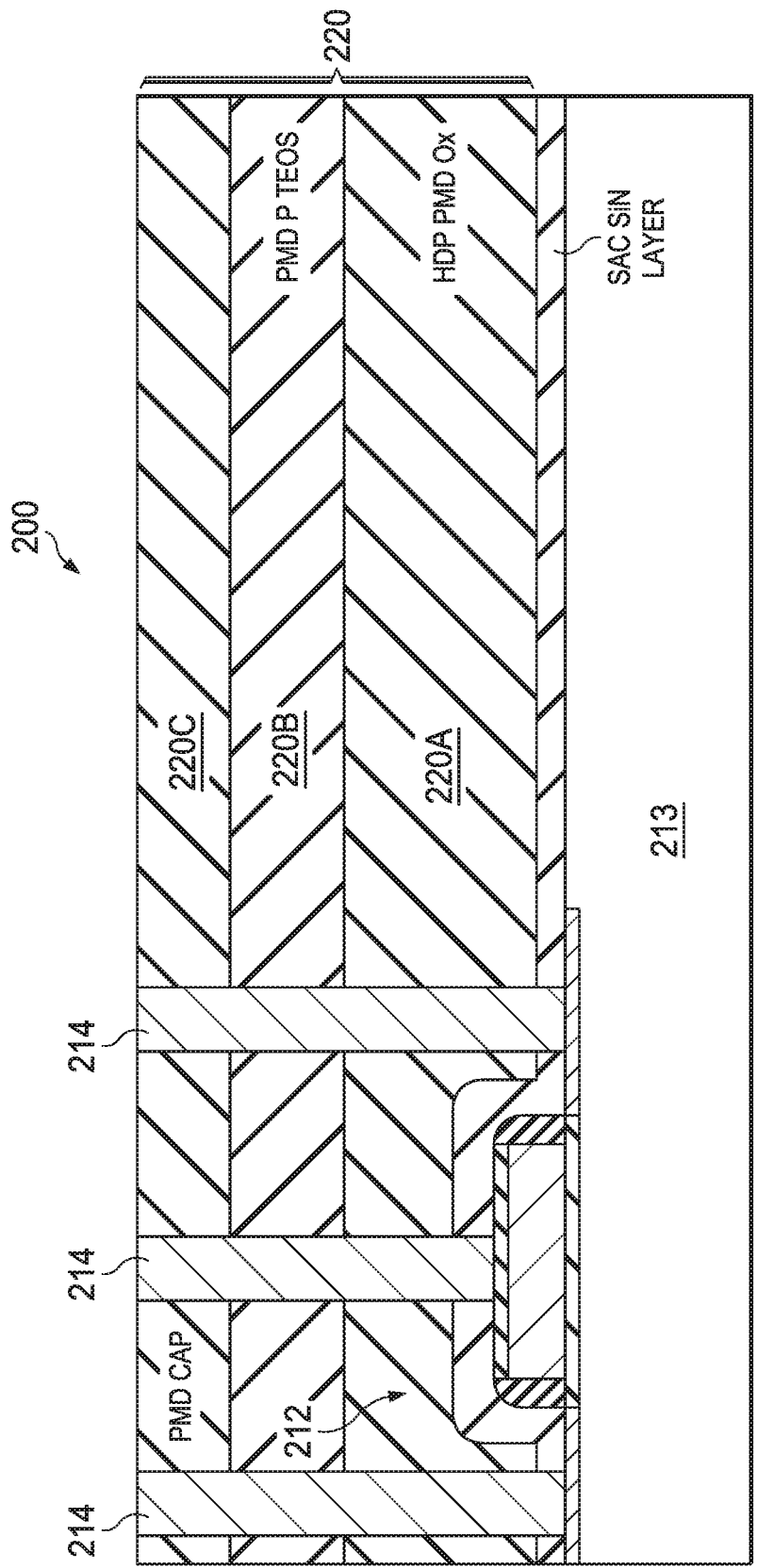
FIGS. 2A-2M illustrate steps of a second example method of integrating a thin film resistor (TFR) in a semiconductor integrated circuit (IC) device, according to a second example embodiment of the invention.

FIG. 2A illustrates an example integrated circuit (IC) structure 200, e.g., during the manufacturing of an IC device. In this example, the IC structure 200 includes a transistor structure 212 formed over a substrate 213, with a plurality of conductive contacts 214, e.g., tungsten vias, extending though a bulk insulation region 220 formed over the transistor structure 212. However, the IC structure 200 may include any other IC devices(s) or structure(s), e.g., one or more full or partial memory cells or memory cell structures, and conductive contacts associated with such structures. In this example embodiment, the bulk insulation region 220 includes (a) a high-density plasma (HDP) premetal dielectric (PMD) oxide layer 220A, (b) a PMD oxide film 220B, e.g., PMD P TEOS (phosphorous-doped tetraethyl orthosilicate film), and (c) a PMD cap layer 220C.

FIG. 2A may represent a state during an IC fabrication process after formation of tungsten vias 214 and a chemical mechanical polish (W CMP) process at the top of the structure 200.

Figure 2B:
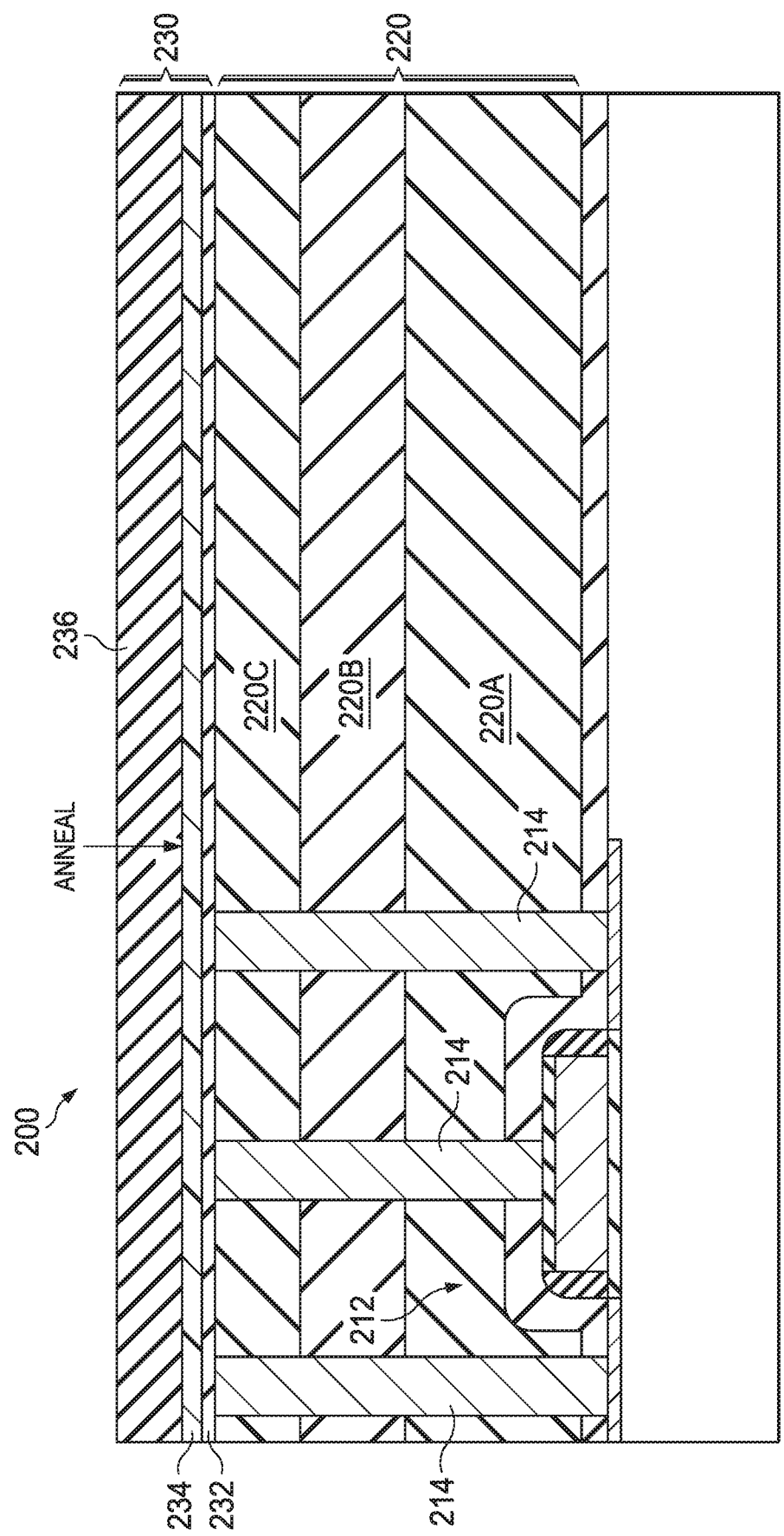

Next, as shown in FIG. 2B, a TFR layer stack 230 is formed over the bulk insulation region 220 and conductive contacts 214. First, a dielectric etch stop layer 232, e.g., a SiN layer, may be formed, e.g., to protect the tungsten vias 214 from a subsequent TFR etch shown below at FIG. 2E. A thin resistive film layer (TFR film layer) 234 may then be formed on the dielectric etch stop layer 232. The TFR film layer 234 may comprise, SiCCr, SiCr, TaN, TiN, or any other suitable TFR material.

In some embodiments, e.g., the example embodiment shown in FIGS. 2A-2M, a TFR anneal may be performed at this point, e.g., to tune or optimize a temperature coefficient of resistance (TCR) of the TFR film layer 234. For example, an anneal may be performed at a temperature of ≥500° C. In some embodiments, the TFR anneal may comprise an anneal at 515° C.±10° C. for a duration of 15-60 minutes, e.g., 30 min. In other embodiments, the TFR anneal may be performed at any other point in the process, prior to the deposition of the first metal layer/interconnect layer 260 (e.g., "Metal 1" layer) discussed below with reference to FIG. 2K. For example, in some embodiments, the TFR anneal may be performed after forming the TFR oxide cap layer 236 discussed below. In other embodiments, the TFR anneal may be performed after the TFR etch discussed below with respect to FIG. 2E. In other embodiments, the TFR anneal may be performed after completing the TFR contact etch described below with respect to FIG. 2I.

After the TFR anneal shown in FIG. 2B, a TFR oxide cap layer 236 may be formed on the TFR film layer 234. In some embodiments, the TFR oxide cap layer 236 may comprise the same film as the PMD cap layer 220C below the dielectric etch stop layer 232, but may have a reduced thickness as compared with the PMD cap layer 220C.

Figure 2C:
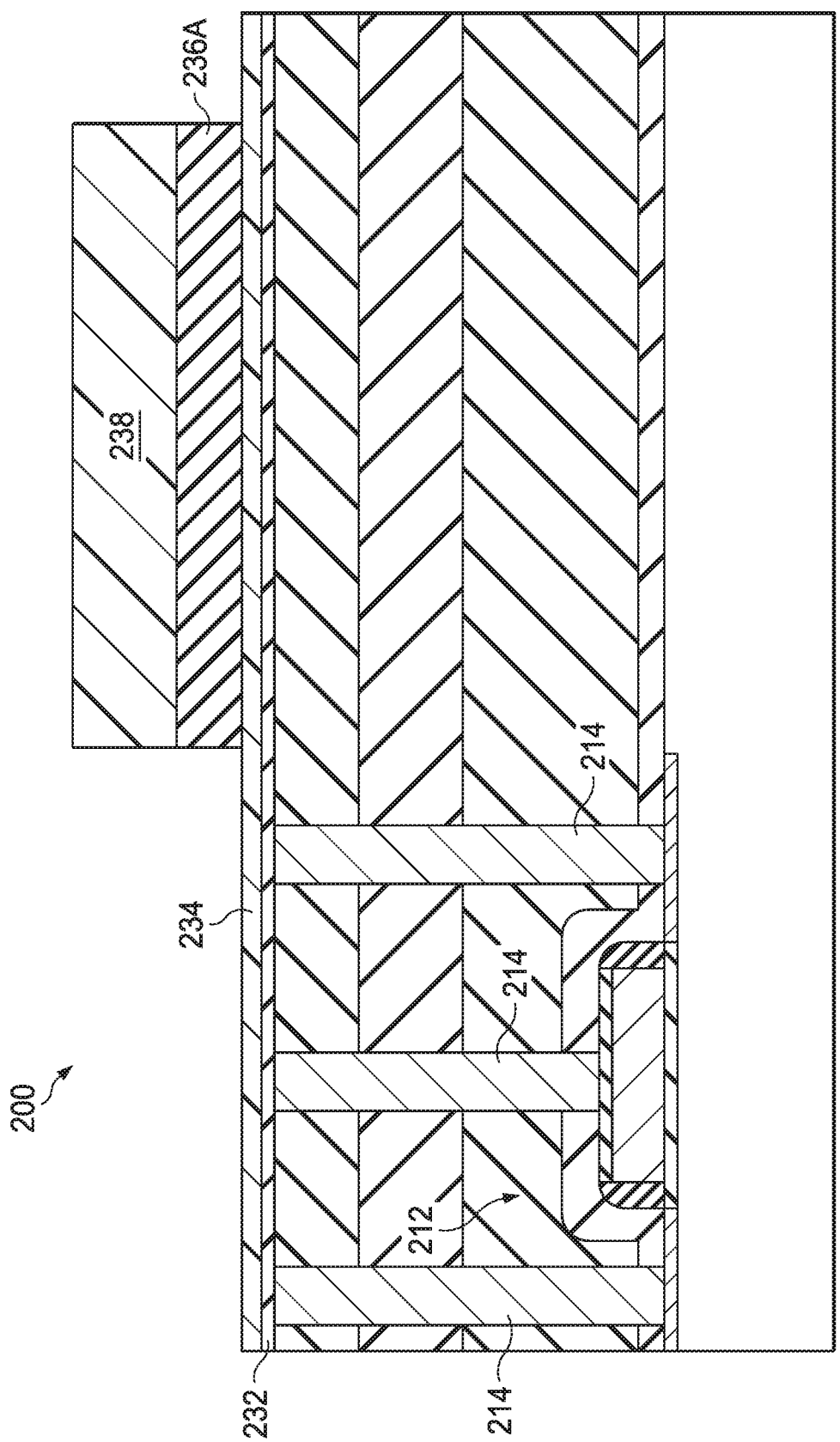

As shown in FIG. 2C, a first photomask 238 may be formed and patterned on the TFR oxide cap layer 236 (e.g., using known photolithographic techniques), in this example at a location laterally offset from the underlying transistor structure 212, and an etch (e.g., a dry etch) may then be performed to remove exposed portions of the TFR oxide cap layer 236, and stopping on the underlying TFR film layer 234, to thereby define a TFR oxide cap 236A.

Figure 2D:
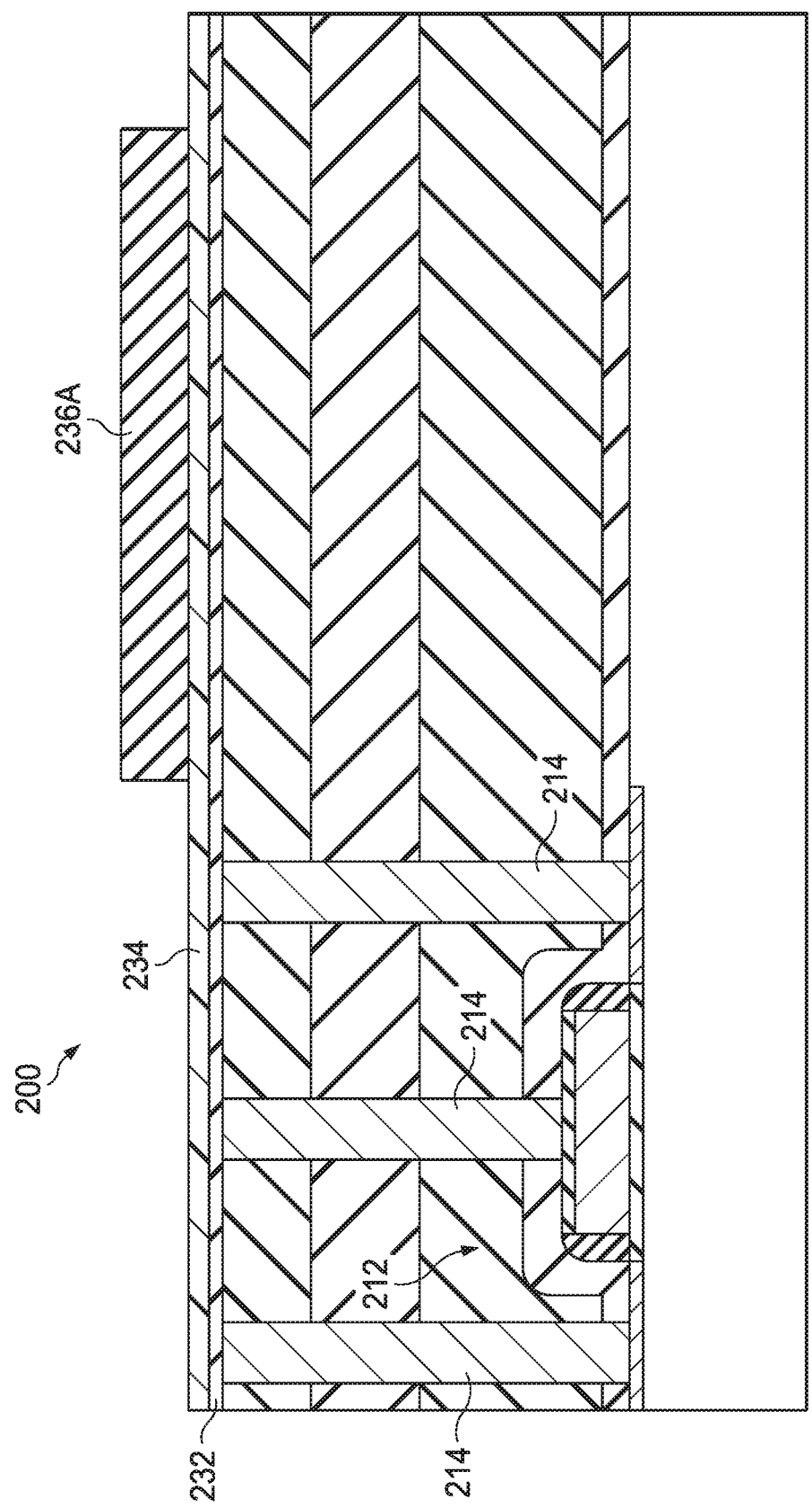

As shown in FIG. 2D, remaining portions of the photoresist 238 may be removed, e.g., using an ash resist.

Figure 2E:
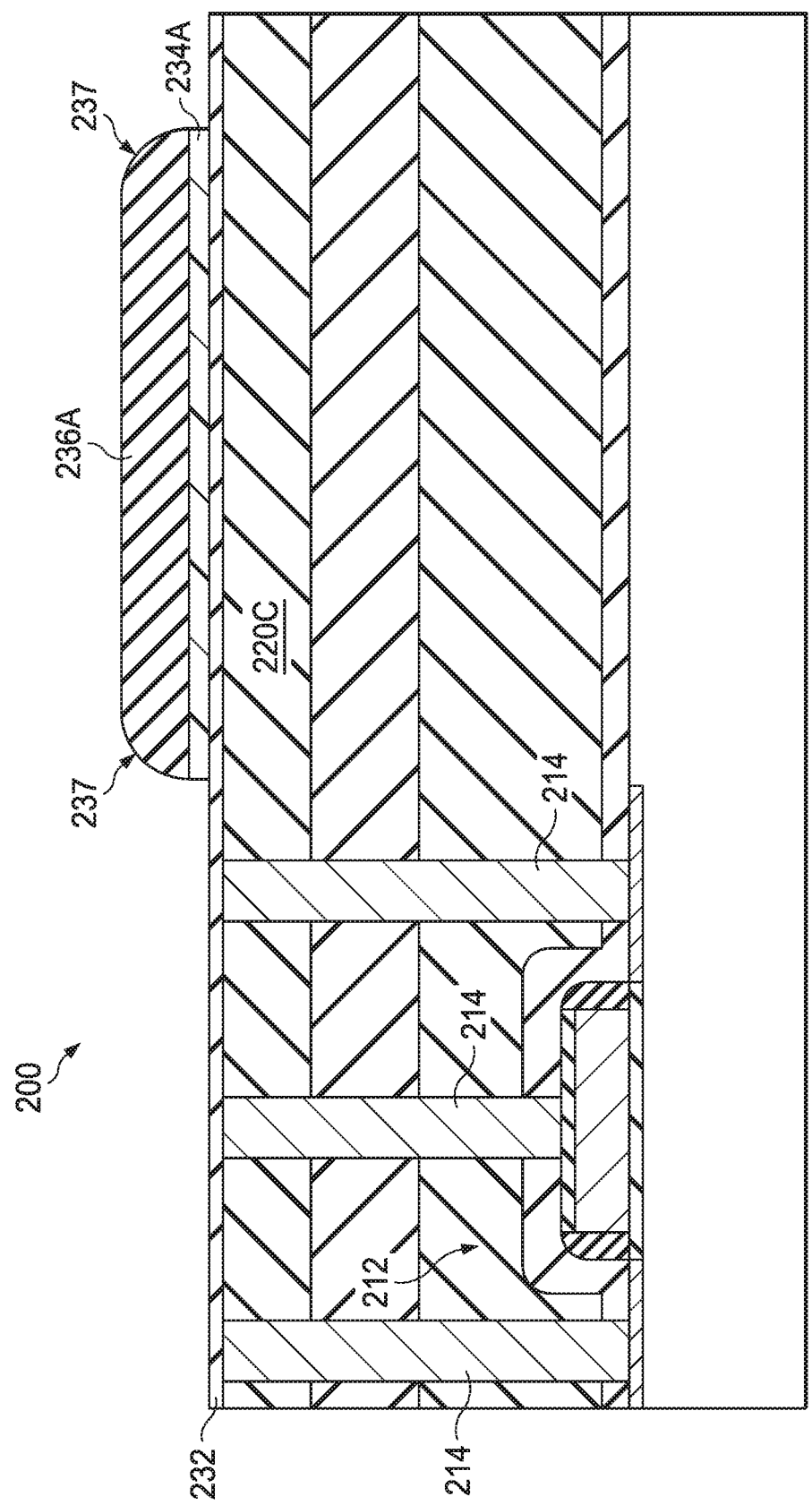

As shown in FIG. 2E, a TFR etch (e.g., a dry etch) may be performed, using the TFR oxide cap 236A as a hardmask, to remove exposed portions of the TFR film layer 234, to thereby define a TFR element 234A. As shown, the TFR film etch may round the exposed upper corners 237 of the TFR oxide cap 236A, and may stop on the dielectric etch stop layer 232 to protect the underlying structures, e.g., tungsten contacts 214. Using the TFR oxide cap 236A as a hardmask for the TFR etch avoids the need to use a photomask for this etch, which may eliminate the formation of polymer residue from the photomask and thus the typical problems associated with removing such polymer residue.

Figure 2F:
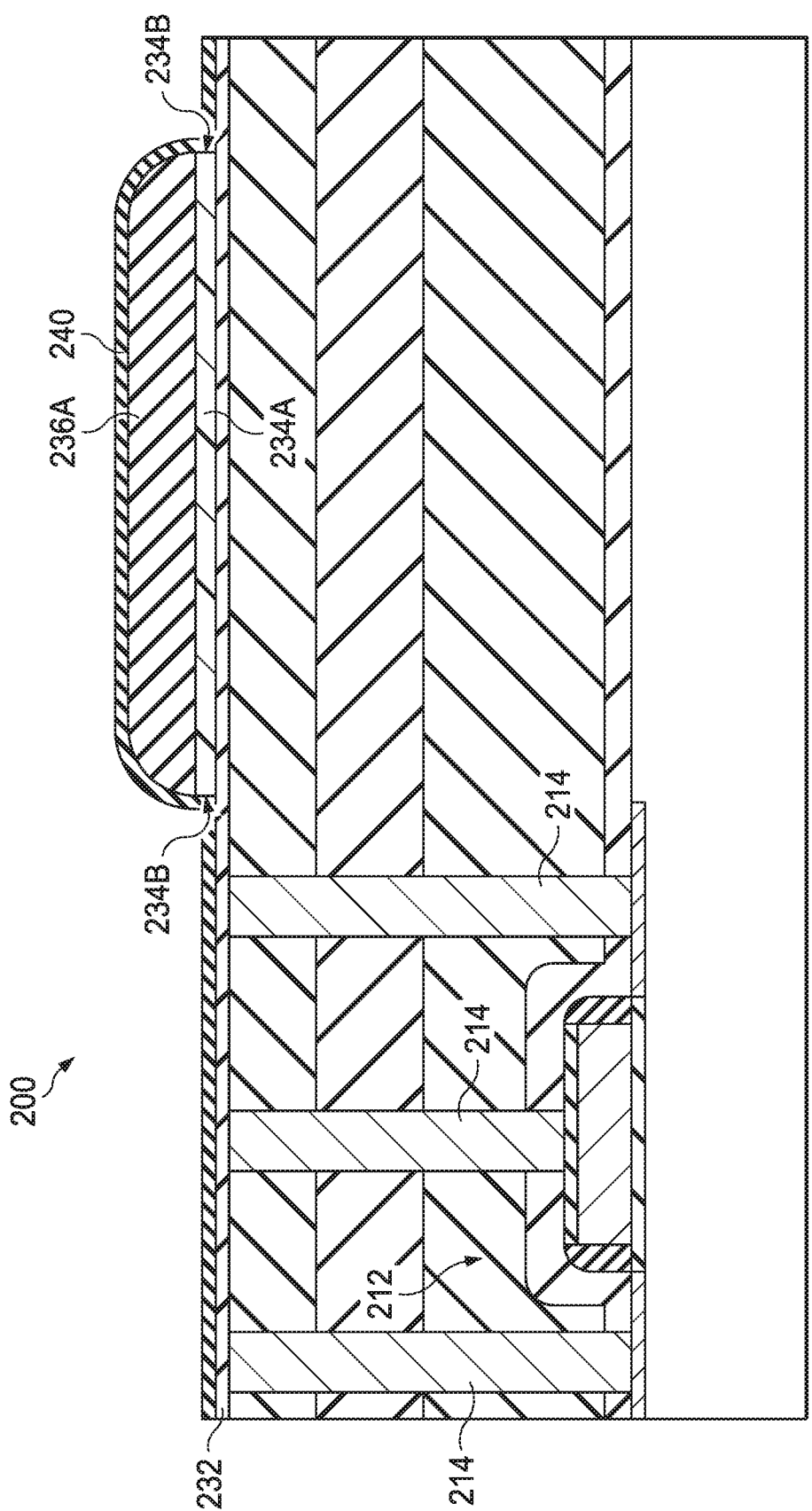

As shown in FIG. 2F, a spacer oxide layer 240 is deposited over the structure, e.g., to encapsulate or insulate lateral edges 234B of the TFR element 234A.

Figure 2G:
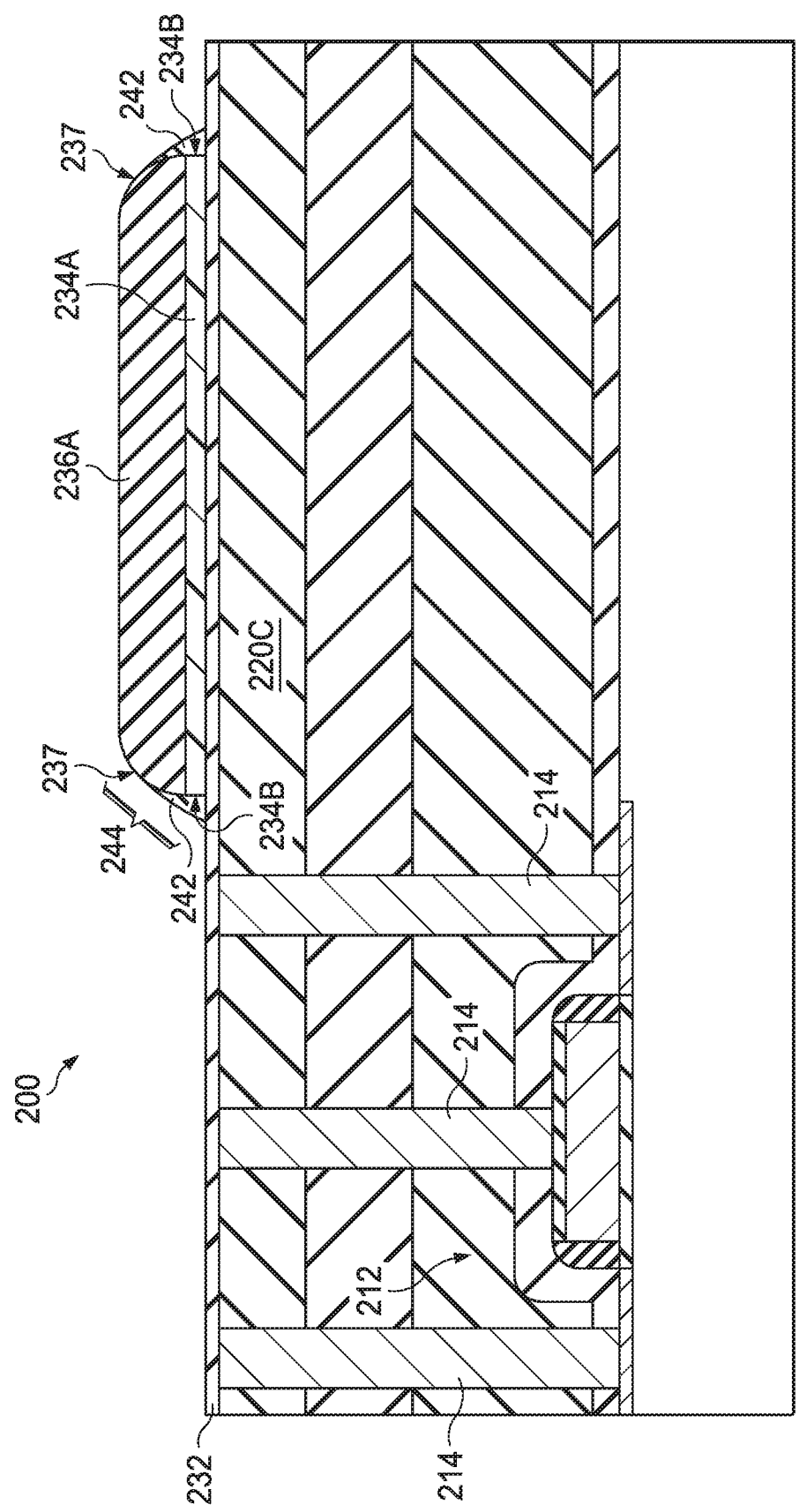

As shown in FIG. 2G, an etch is performed to remove portions of the spacer oxide layer 240, but leaving TFR edge oxide spacers 242 that insulate the lateral edges 234B of the TFR element 234A. As shown, each TFR edge oxide spacer 242 may cover a respective TFR lateral edge 234B and a portion of a respective rounded corner 237 of the TFR oxide cap 236A. Further, each TFR edge oxide spacer 242 may have a rounded and/or sloped (non-vertical) outer sidewall surface, which may combine with the respective curved upper corner 237 of the oxide cap 236A to define a generally rounded and/or sloped (i.e., non-vertical) insulating structure, e.g., as generally indicated at 244, covering the lateral edges 234B of the TFR element 234A, which may further reduce the occurrence of electrical shorts ("stringers") along the TFR element 234A and between adjacent metal structures (e.g., Metal 1 layer structures formed as discussed below).

Figure 2H:
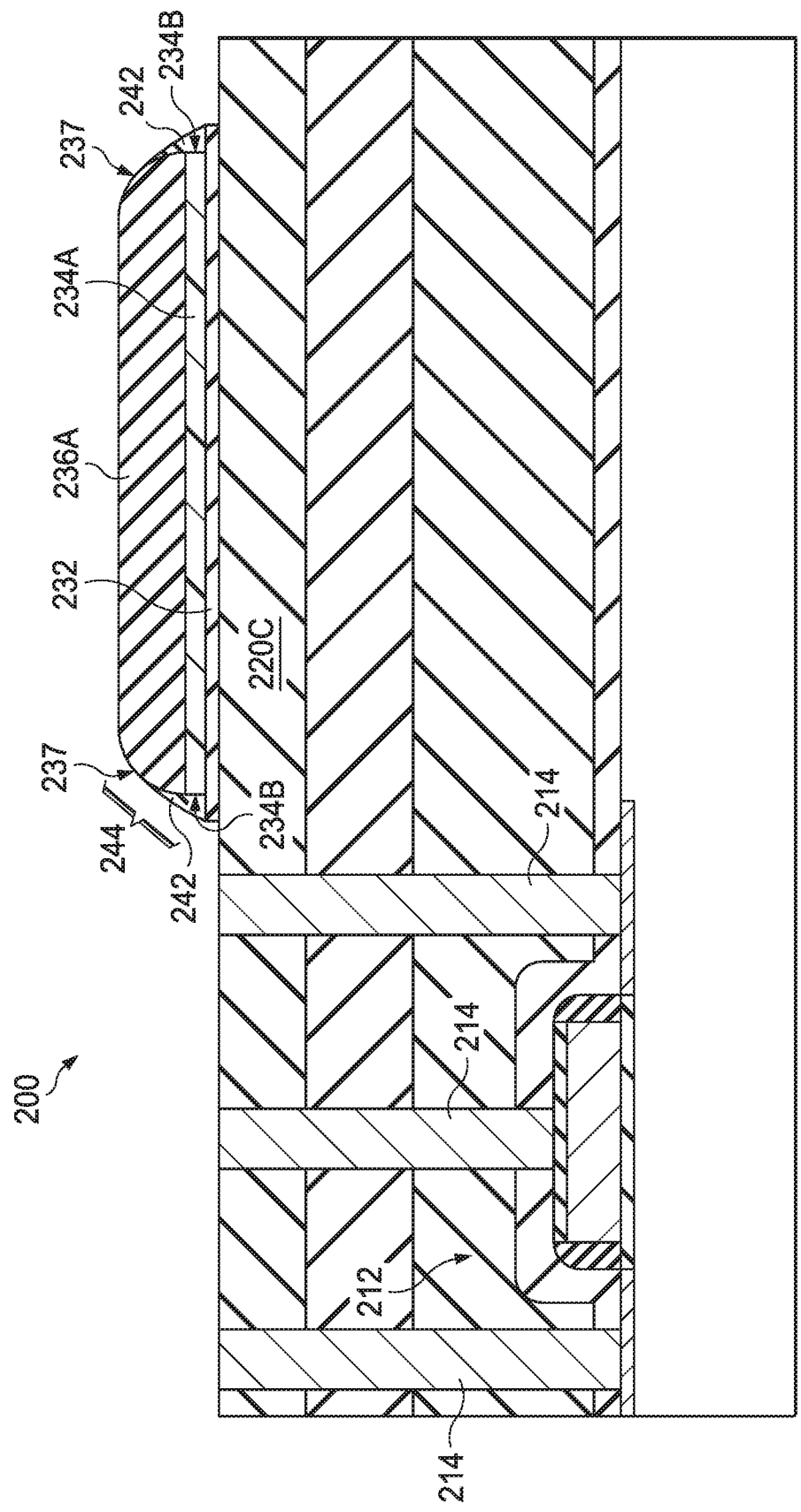

As shown in FIG. 2H, a further etch may be performed to remove exposed portions of the dielectric etch stop layer 232. In an embodiment in which dielectric etch stop layer 232 comprises a SiN layer, the etch shown in in FIG. 2H may comprise a gentle SiN clear etch to protect the underlying tungsten contacts 214.

Figure 2I:
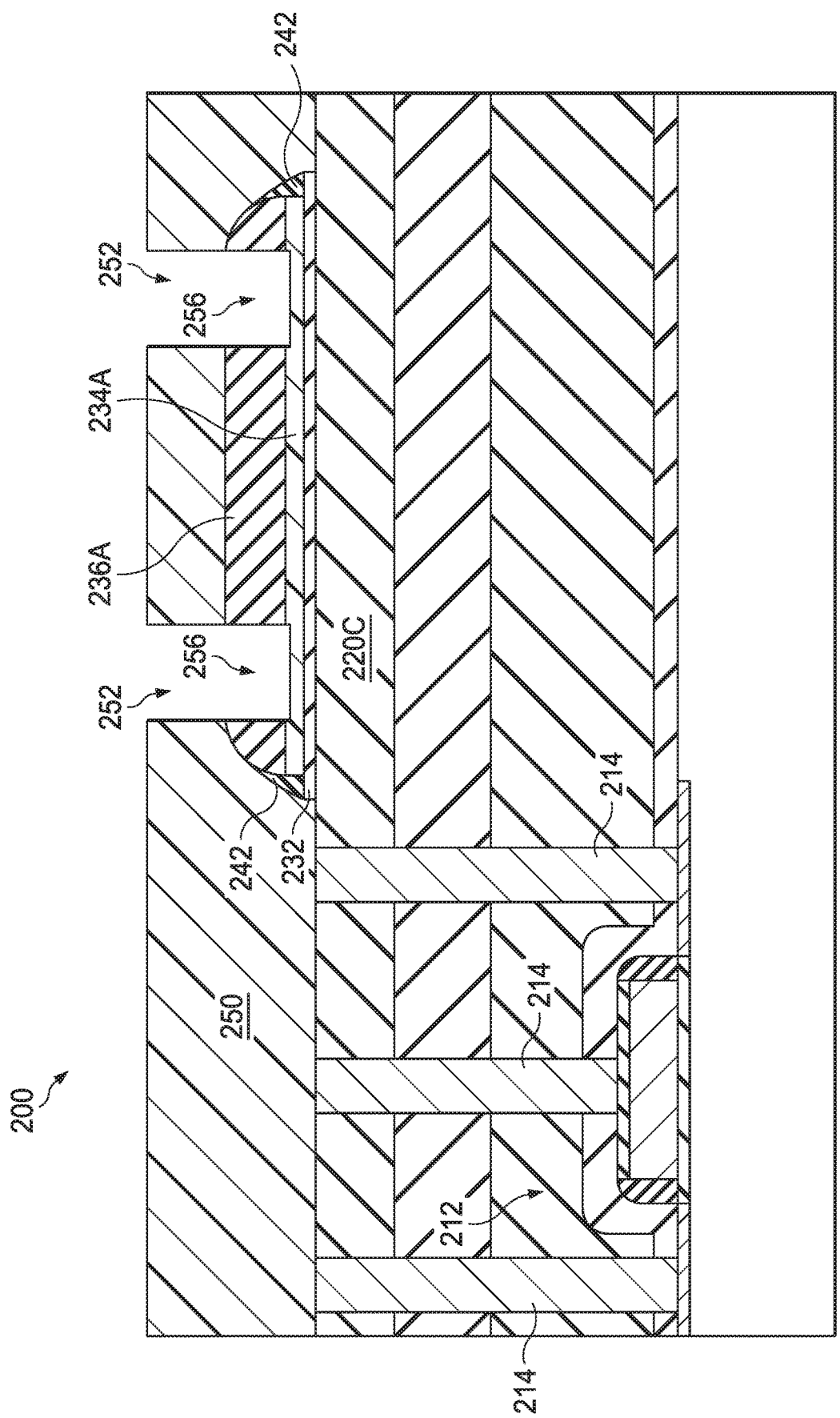

As shown in FIG. 2I, a second photomask is deposited over the structure and patterned to define a pair of mask openings aligned over the TFR element. A TFR contact etch is then performed through the mask openings 252 to define TFR contact openings 256 in the TFR oxide cap 236A, and stopping on the TFR element 234A. The TFR contact etch may be a wet etch or a dry etch. A wet etch may improve the flow of metal during a subsequent metal deposition (e.g., the Metal 1 layer deposition shown in FIG. 2K), and may reduce the occurrence of electrical shorts (often referred to as "stringers") along the TFR element 234A and between adjacent metal structures (e.g., Metal 1 layer structures).

Figure 2J:
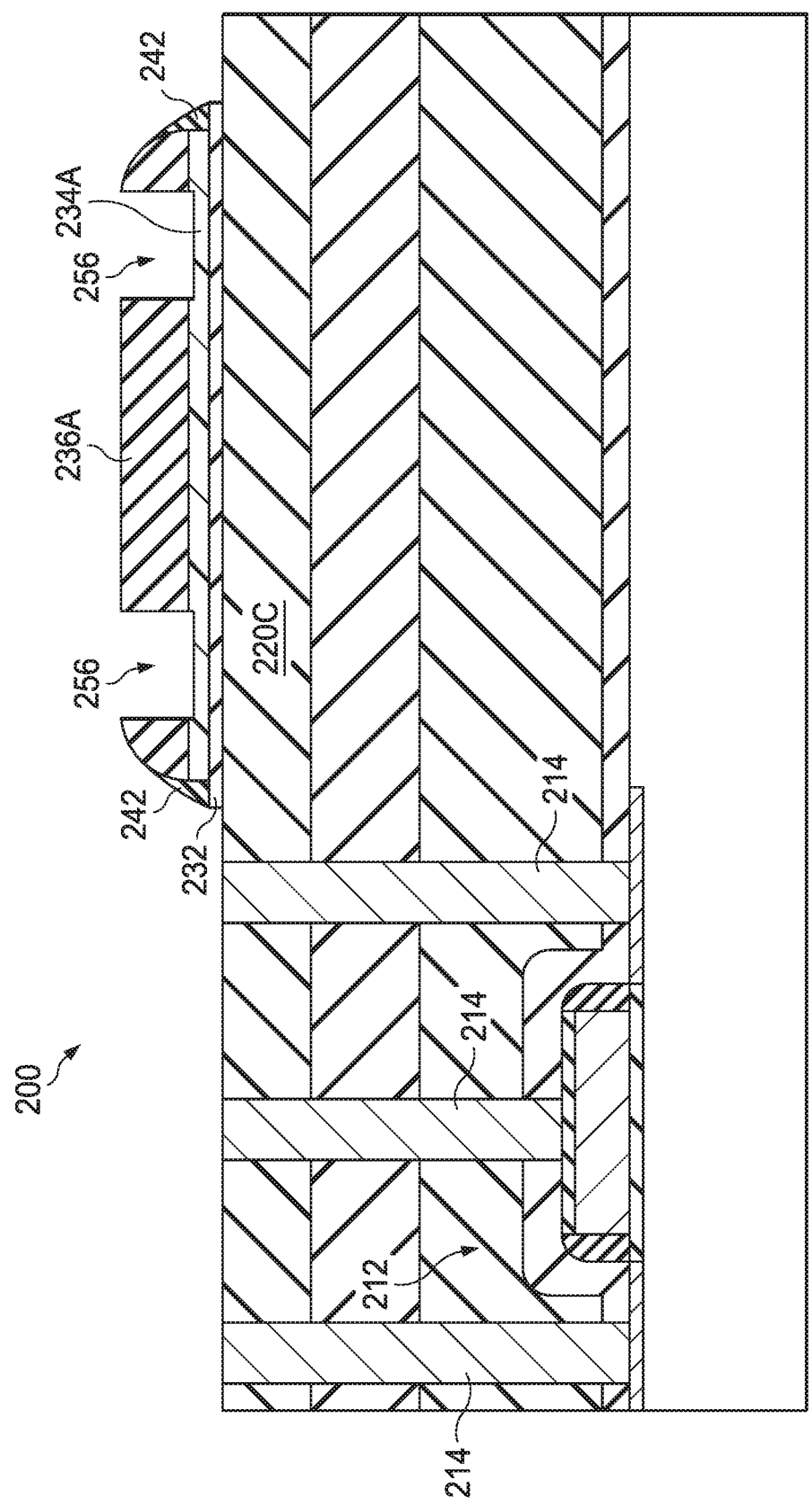

As shown in FIG. 2J, the remaining portion of the second photomask 250 may be removed, e.g., by a resist strip.

Figure 2K:
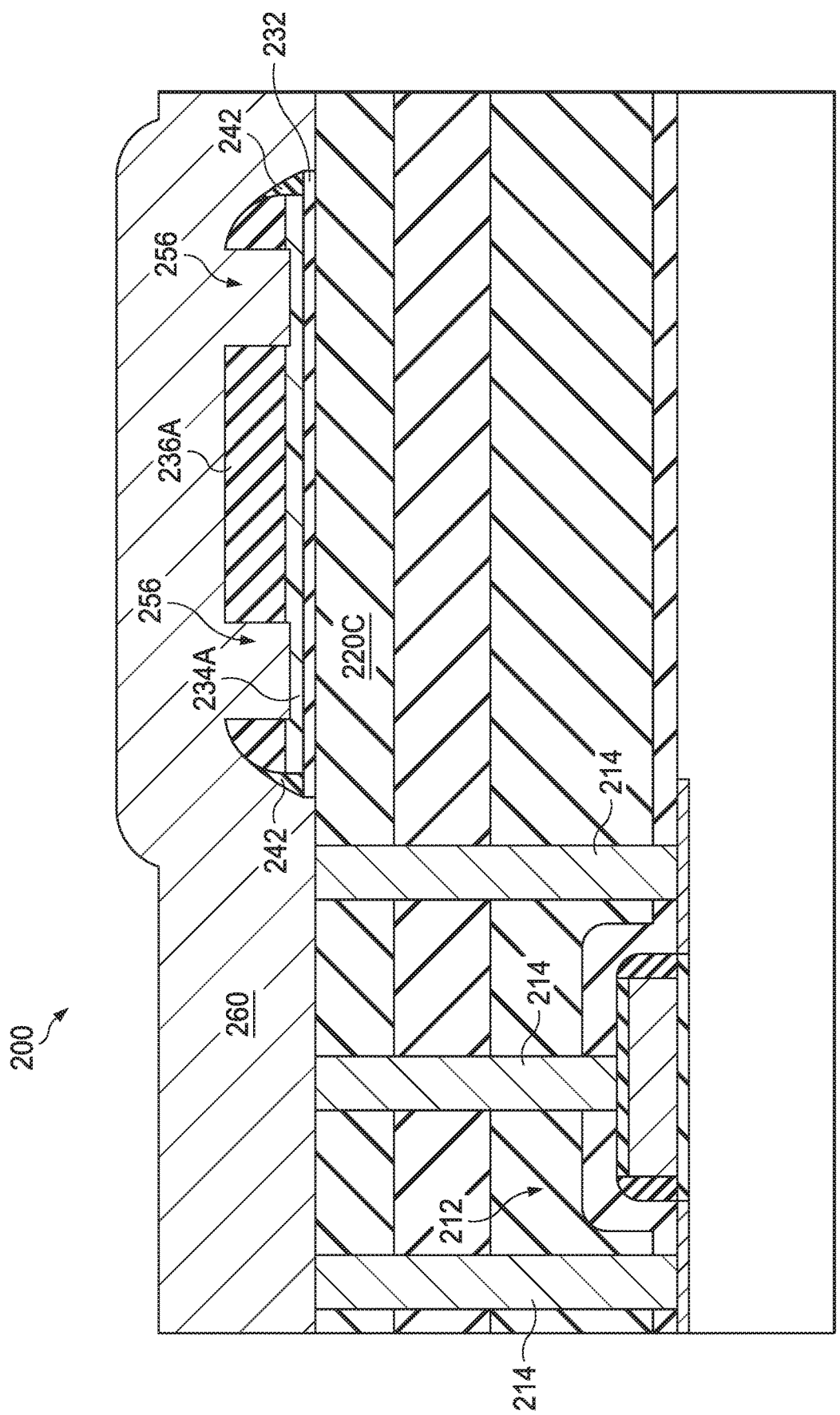

As shown in FIG. 2K, the IC device processing may continue, by forming a first metal layer/interconnect layer, referred to as a "Metal 1" layer 260. In the illustrated embodiment, Metal 1 layer 260 comprises aluminum. In other embodiments, Metal 1 layer 260 may comprise copper or other metal. As shown, Metal 1 layer 260 extends into the oxide cap openings 256 to thereby contact the TFR element 234A at opposing sides of the TFR element 234A. Metal 1 layer 260 also extends over and in contact with tungsten contacts 214.

Figure 2L:
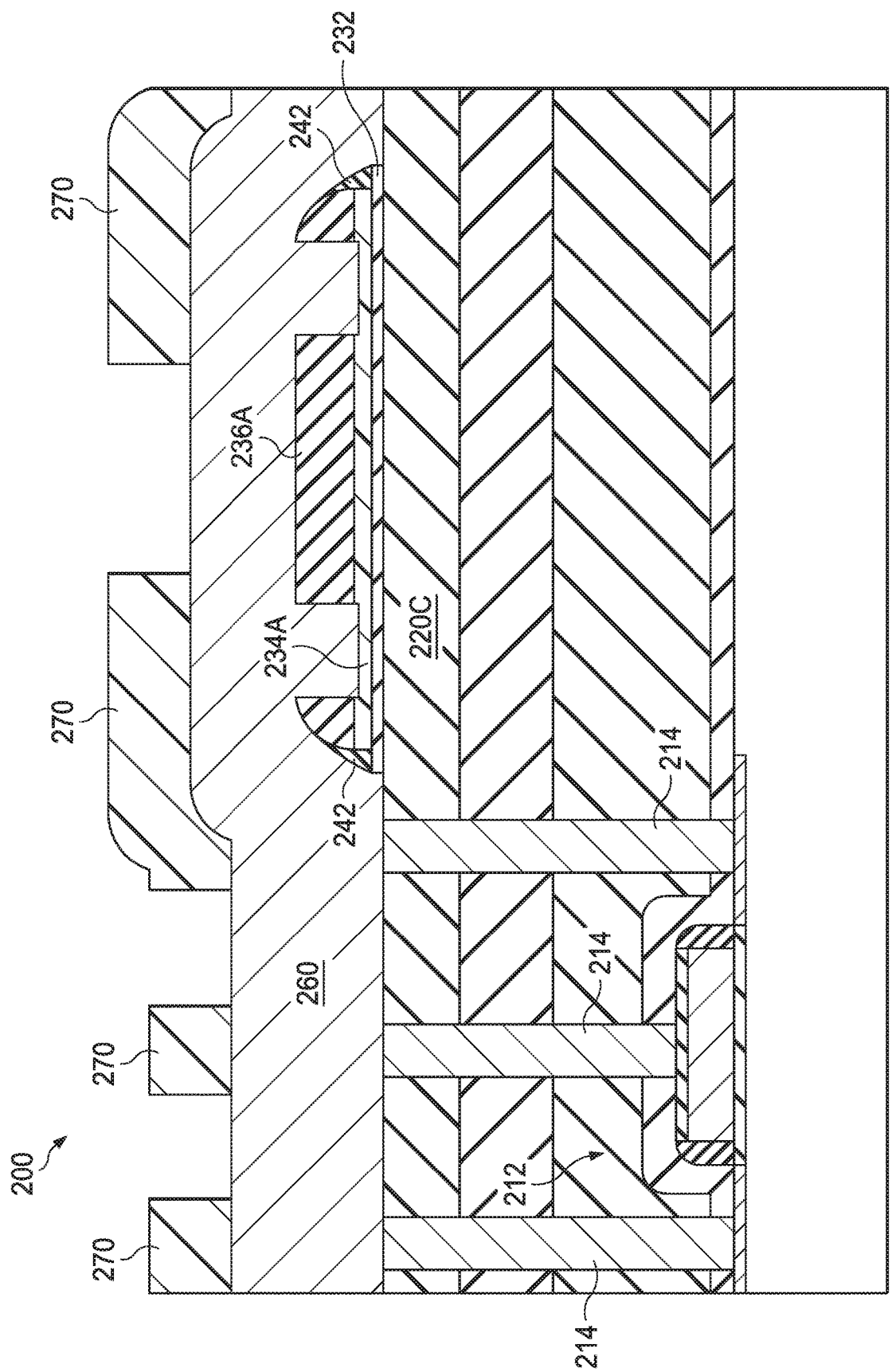

Next, as shown in FIG. 2L, a third photomask 270 may be formed and patterned over the Metal 1 layer.

Figure 2M:
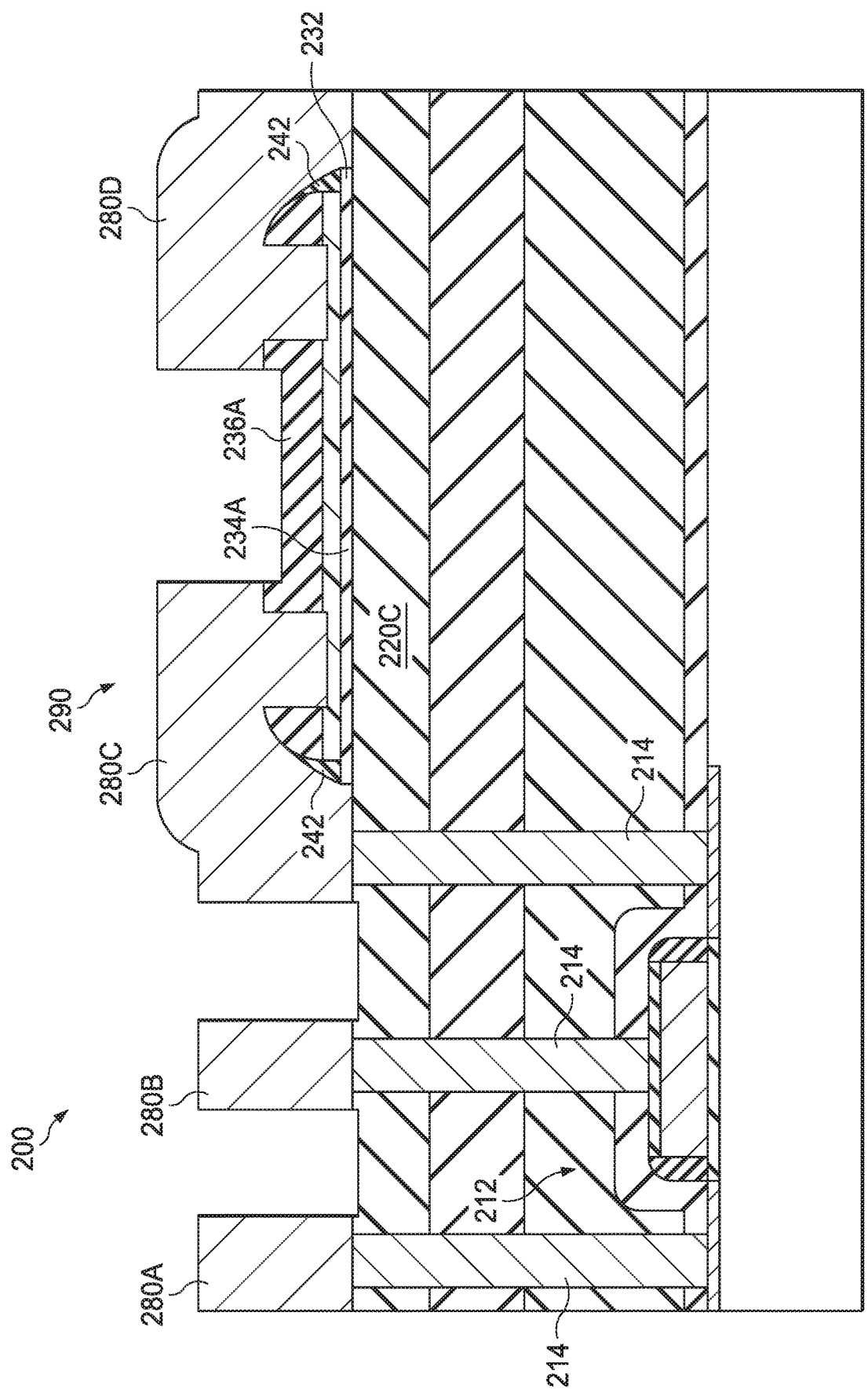

Finally, as shown in FIG. 2M, the aluminum Metal 1 layer 260 may be etched using the third photomask 270 to define a plurality of aluminum Metal 1 elements (e.g., metal interconnect elements) 280A-280D, and the remaining photoresist material 270 may then be removed. For example, as shown, the Metal 1 layer may be etched to define aluminum interconnect elements 280A and 280B in contact with tungsten vias 214, and aluminum interconnect elements 280C and 280D in contact with the opposing sides of the TFR element 234A. In this example illustration, a first aluminum interconnect element 280C conductively connects a first side of the TFR element 234A with a tungsten via 214A coupled to a source or drain region of the transistor 212, and a second interconnect element 280D conductively contacts a second side of the TFR element 234A with other IC element structure(s) (not shown). The TFR element 234A and the first and second interconnect elements 280C and 280D collectively define an integrated TFR, indicated at 290.

As shown in FIG. 2M, the TFR edge oxide spacers 242 remain over the lateral edges 234B of the TFR element 234A, to thereby insulate the TFR element lateral edges 234B, and thereby reduce the occurrence of electrical shorts ("stringers"), as discussed above.

As discussed below, e.g., with respect to FIGS. 4A-4C and 5A-5C, the rounded and/or sloped insulating structure 244 covering the lateral edges 234B of the TFR element 234A may facilitate the removal of selected portions of the Metal 1 layer 260 adjacent selected lateral edges 234B of the TFR element 234A, e.g., to further prevent electrical shorts ("stringers") in the completed device.

FIGS. 3A-3K illustrate an example method of integrating a thin film resistor (TFR) in a semiconductor integrated circuit (IC) device, according to one example embodiment.

Figure 3A:
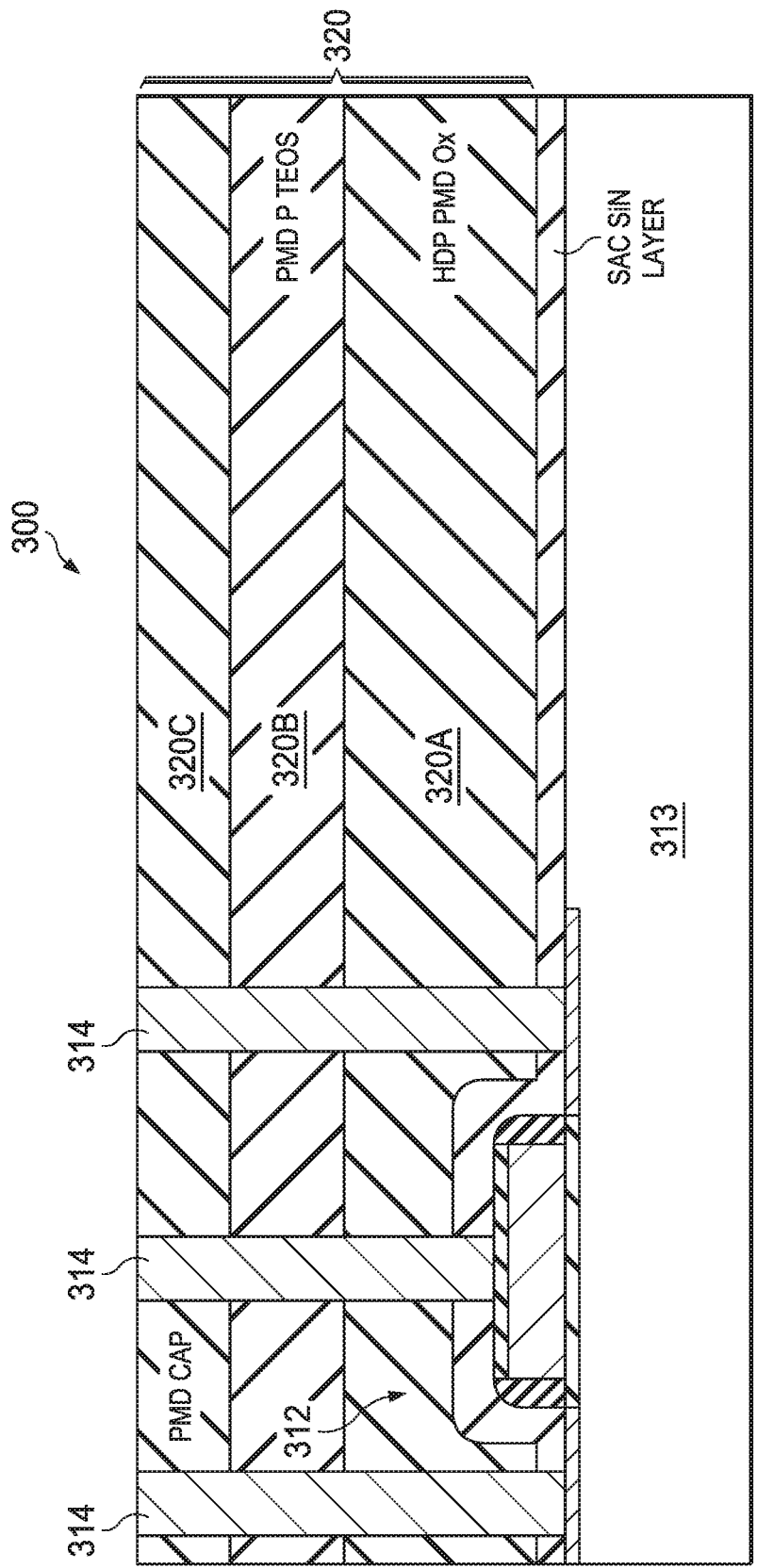
FIGS. 3A-3M illustrate steps of a third example method of integrating a thin film resistor (TFR) in a semiconductor integrated circuit (IC) device, according to a third example embodiment of the invention.

FIG. 3A illustrates an example integrated circuit (IC) structure 300, e.g., during the manufacturing of an IC device. In this example, the IC structure 300 includes a transistor structure 312 formed over a substrate 313, with a plurality of conductive contacts 314, e.g., tungsten vias, extending though a bulk insulation region 320 formed over the transistor structure 312. However, the IC structure 300 may include any other IC devices(s) or structure(s), e.g., one or more full or partial memory cells or memory cell structures, and conductive contacts associated with such structures. In this example embodiment, the bulk insulation region 320 includes (a) a high-density plasma (HDP) pre-metal dielectric (PMD) oxide layer 320A, (b) a PMD oxide film 320B, e.g., PMD P TEOS (phosphorous-doped tetraethyl orthosilicate film), and (c) a PMD cap layer 320C.

FIG. 3A may represent a state during an IC fabrication process after formation of tungsten vias 314 and a chemical mechanical polish (W CMP) process at the top of the structure 300.

Figure 3B:
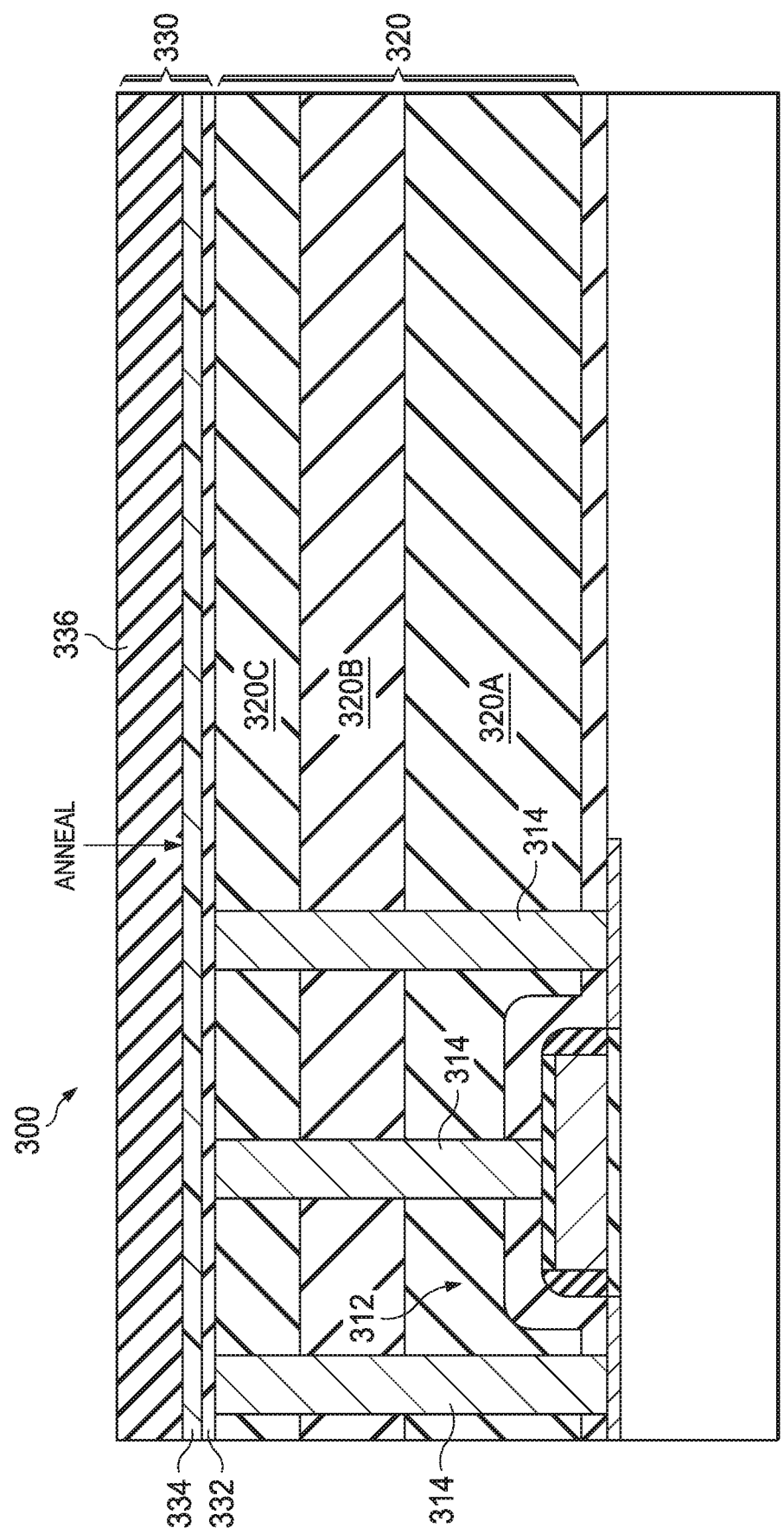

Next, as shown in FIG. 3B, a TFR layer stack 330 is formed over the bulk insulation region 320 and conductive contacts 314. First, a dielectric etch stop layer 332, e.g., a SiN layer, may be formed, e.g., to protect the tungsten vias 314 from a subsequent TFR etch shown below at FIG. 3E. A thin resistive film layer (TFR film layer) 334 may then be formed on the dielectric etch stop layer 332. The TFR film layer 334 may comprise, SiCCr, SiCr, TaN, TiN, or any other suitable TFR material.

In some embodiments, e.g., the example embodiment shown in FIGS. 3A-3M, a TFR anneal may be performed at this point, e.g., to tune or optimize a temperature coefficient of resistance (TCR) of the TFR film layer 334. For example, an anneal may be performed at a temperature of ≥500° C. In some embodiments, the TFR anneal may comprise an anneal at 515° C.±10° C. for a duration of 15-60 minutes, e.g., 30 min. In other embodiments, the TFR anneal may be performed at any other point in the process, prior to the deposition of the first metal layer/interconnect layer 360 (e.g., "Metal 1" layer) discussed below with reference to FIG. 3K. For example, in some embodiments, the TFR anneal may be performed after forming the TFR oxide cap layer 336 discussed below. In other embodiments, the TFR anneal may be performed after the TFR etch discussed below with respect to FIG. 3E. In other embodiments, the TFR anneal may be performed after completing the TFR contact etch described below with respect to FIG. 3I.

After the TFR anneal shown in FIG. 3B, a TFR oxide cap layer 336 may be formed on the TFR film layer 334. In some embodiments, the TFR oxide cap may comprise the same film as the PMD cap layer 320C below the dielectric etch stop layer 332, but may have a reduced thickness as compared with the PMD cap layer 320C.

Figure 3C:
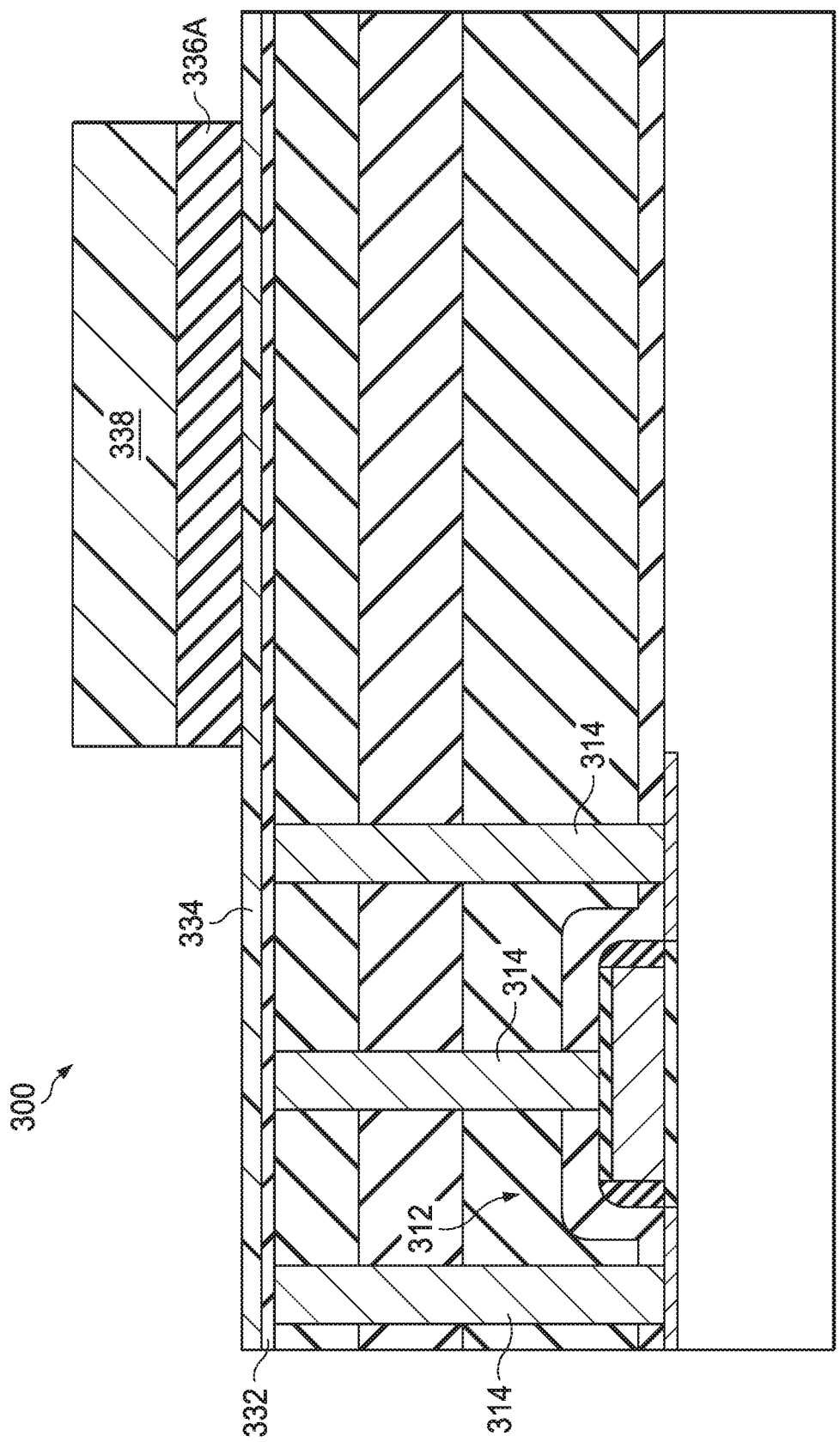

As shown in FIG. 3C, a first photomask 338 may be formed and patterned on the TFR oxide cap layer 336 (e.g., using known photolithographic techniques), in this example at a location laterally offset from the underlying transistor structure 312, and an etch (e.g., a dry etch) may then be performed to remove exposed portions of the TFR oxide cap layer 336, and stopping on the underlying TFR film layer 334, to thereby define a TFR oxide cap 336A.

Figure 3D:
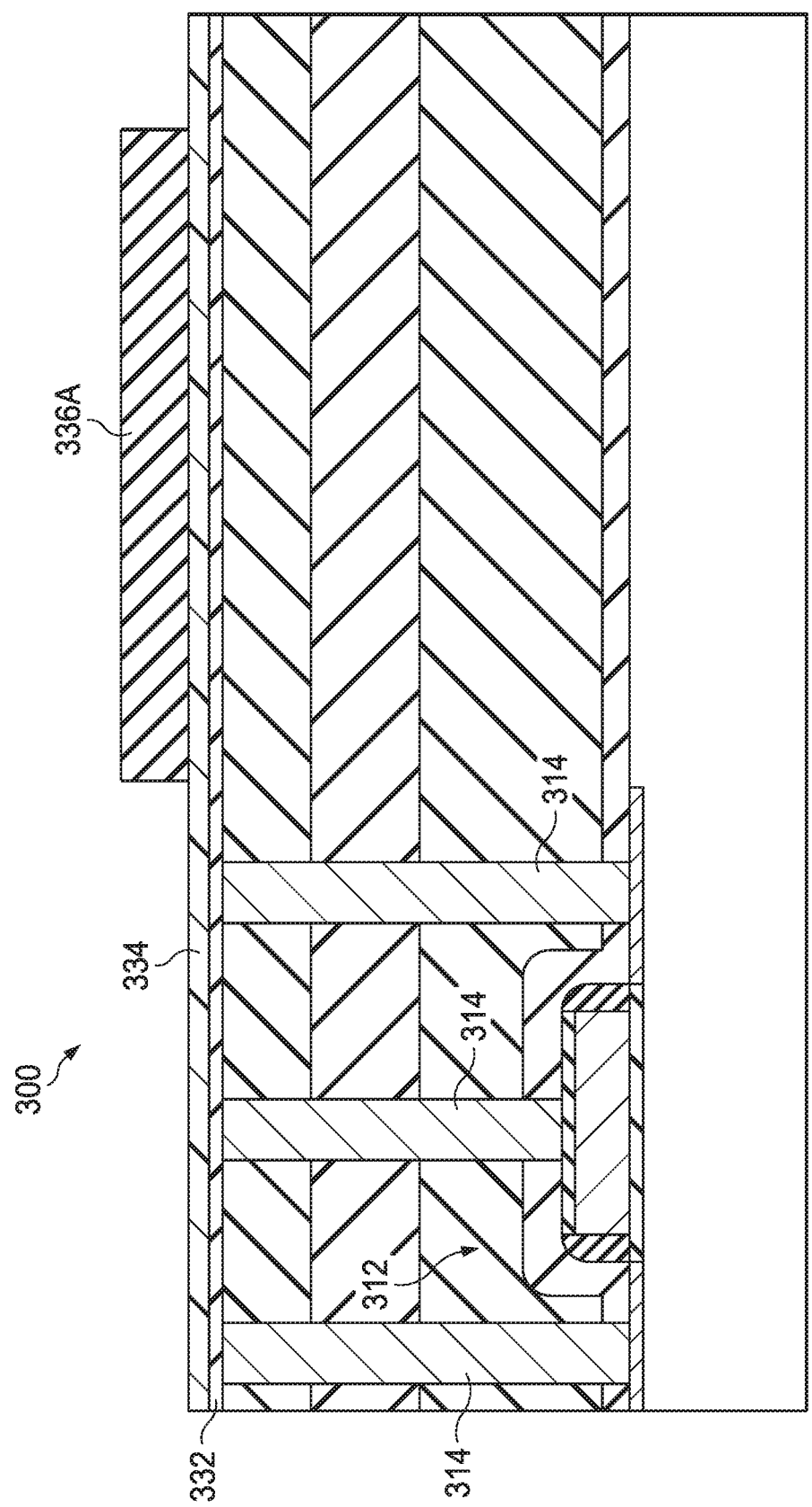

As shown in FIG. 3D, remaining portions of the photoresist 338 may be removed, e.g., using an ash resist.

Figure 3E:
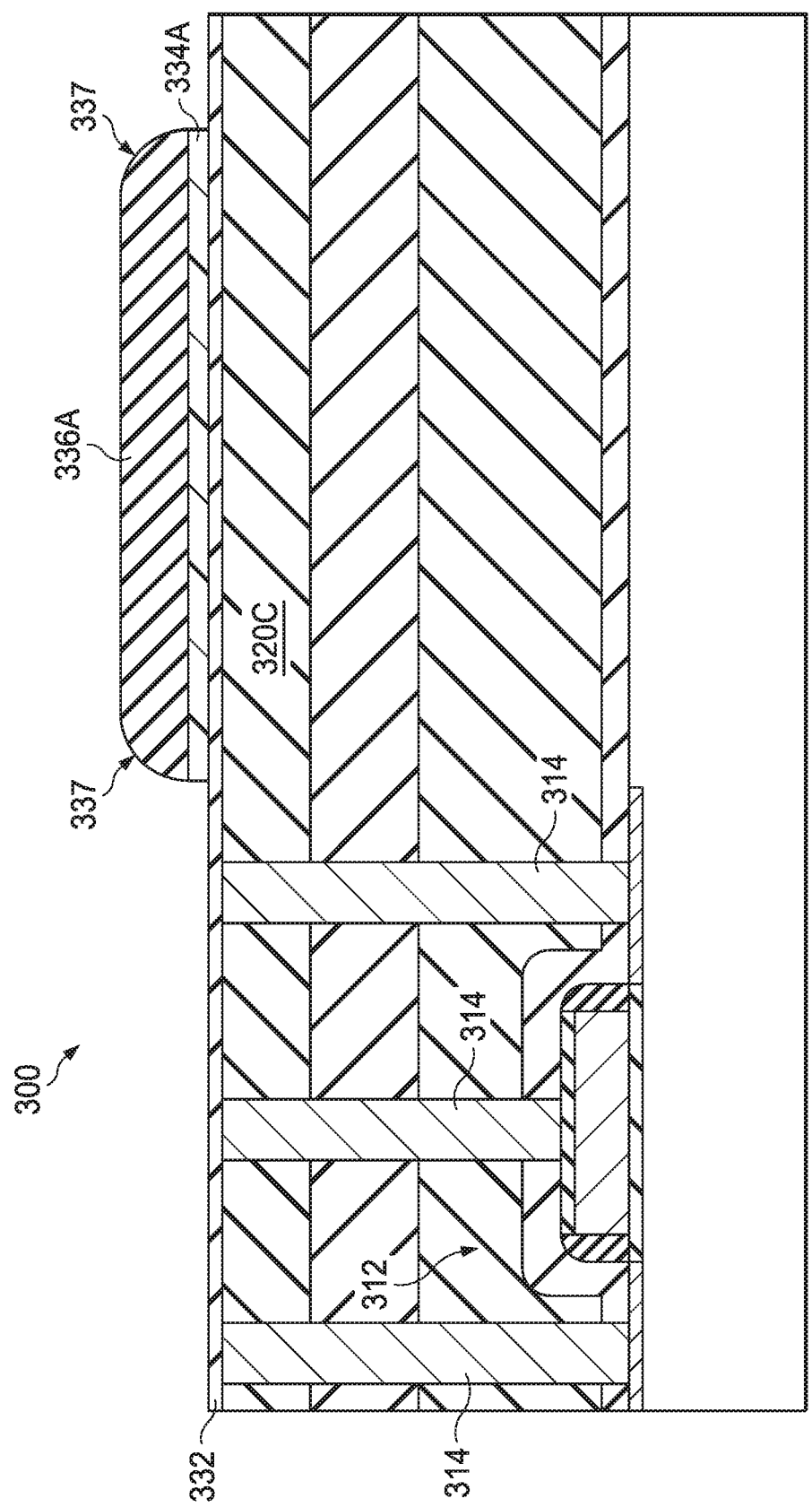

As shown in FIG. 3E, a TFR etch (e.g., a dry etch) may be performed, using the TFR oxide cap 336A as a hardmask, to remove exposed portions of the TFR film layer 334, to thereby define a TFR element 334A. As shown, the TFR film etch may round the exposed upper corners 337 of the TFR oxide cap 336A, and may stop on the dielectric etch stop layer 332 to protect the underlying structures, e.g., tungsten contacts 314. Using the TFR oxide cap 336A as a hardmask for the TFR etch avoids the need to use a photomask for this etch, which may eliminate the formation of polymer residue from the photomask and thus the typical problems associated with removing such polymer residue.

Figure 3F:
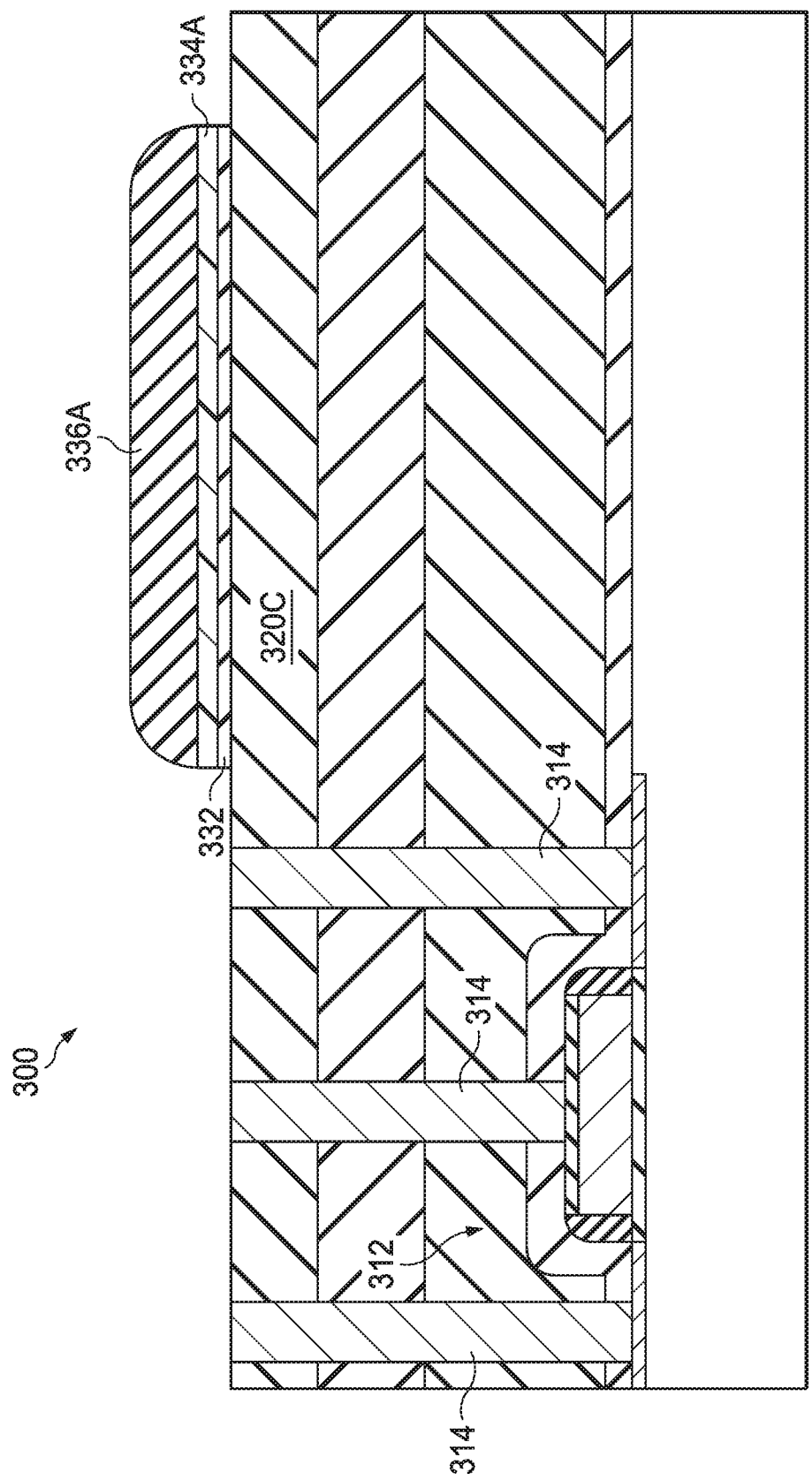

As shown in FIG. 3F, a further etch may be performed to remove exposed portions of the dielectric etch stop layer 332. In an embodiment in which dielectric etch stop layer 332 comprises a SiN layer, the etch shown in in FIG. 3F may comprise a gentle SiN clear etch with high selectivity to oxide, to protect the underlying tungsten contacts 314.

Figure 3G:
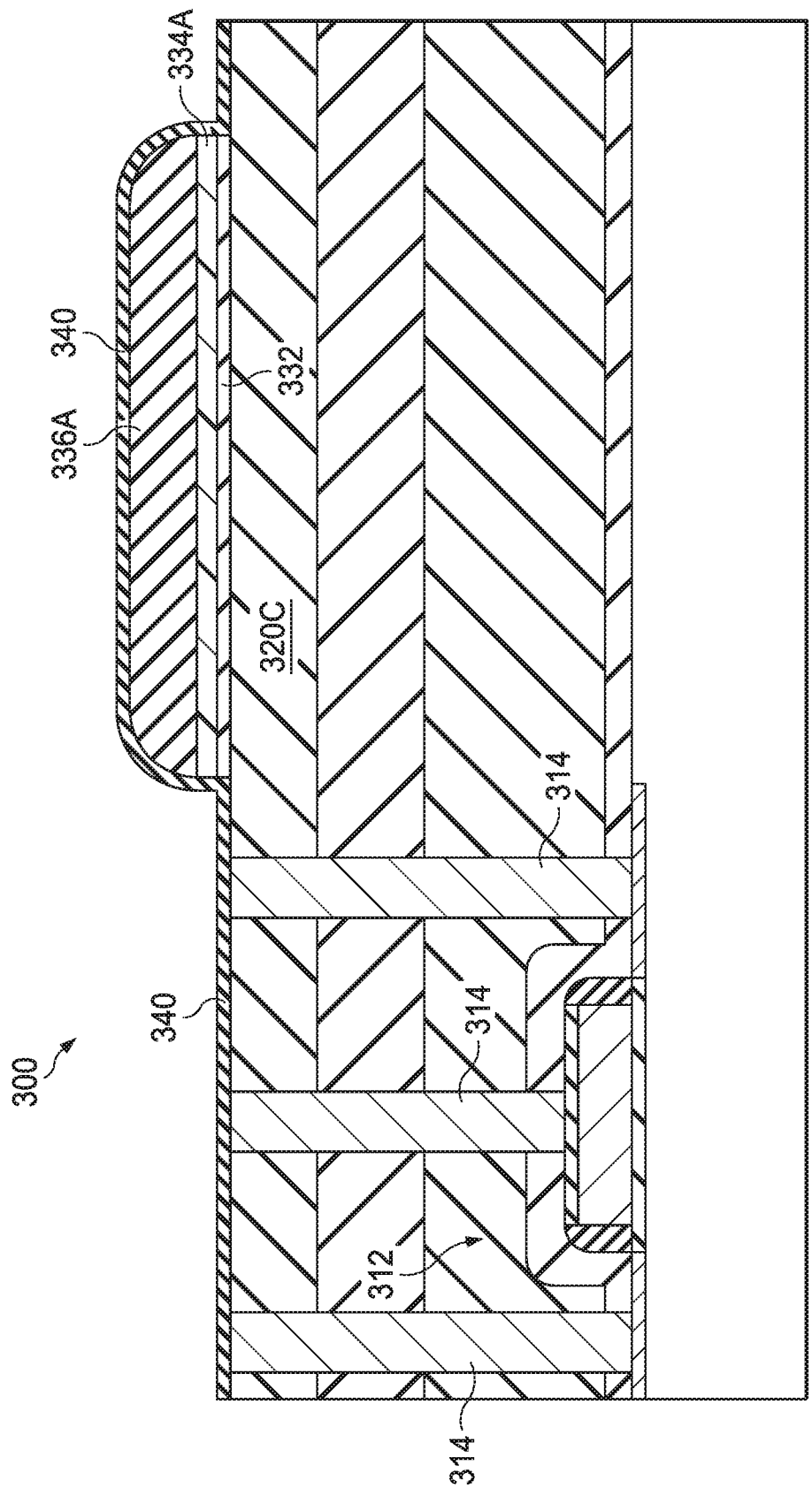

As shown in FIG. 3G, a TFR spacer layer 340 is formed over the structure, for insulating the lateral edges of the TFR element 334A, as discussed below. In some embodiments, the TFR spacer layer 340 comprises a SiN layer or other nitride layer.

Figure 3H:
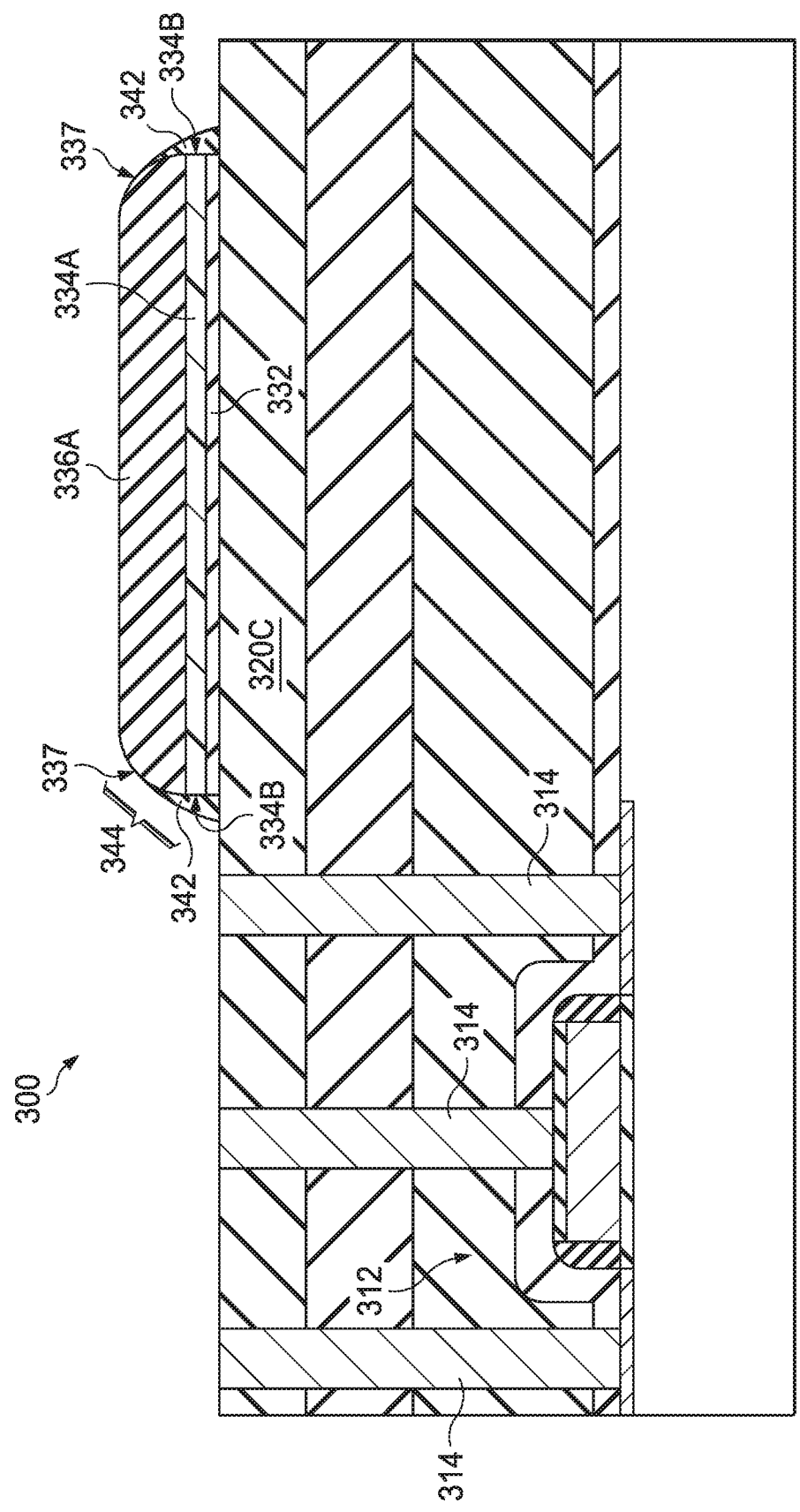

As shown in FIG. 3H, an etch is performed to remove portions of the spacer layer 340, but leaving TFR edge spacers 342 that insulate the lateral edges 334B of the TFR element 334A. As shown, each TFR edge spacer 342 may cover a respective TFR lateral edge 334B and a portion of a respective rounded corner 337 of the TFR oxide cap 336A. Further, each TFR edge spacer 342 may have a rounded and/or sloped (non-vertical) outer sidewall surface, which may combine with the respective curved upper corner 337 of the oxide cap 336A to define a generally rounded and/or sloped (i.e., non-vertical) insulating structure, e.g., as generally indicated at 344, covering the lateral edges 334B of the TFR element 334A, which may further reduce the occurrence of electrical shorts ("stringers") along the TFR element 334A and between adjacent metal structures (e.g., Metal 1 layer structures formed as discussed below).

Figure 3I:
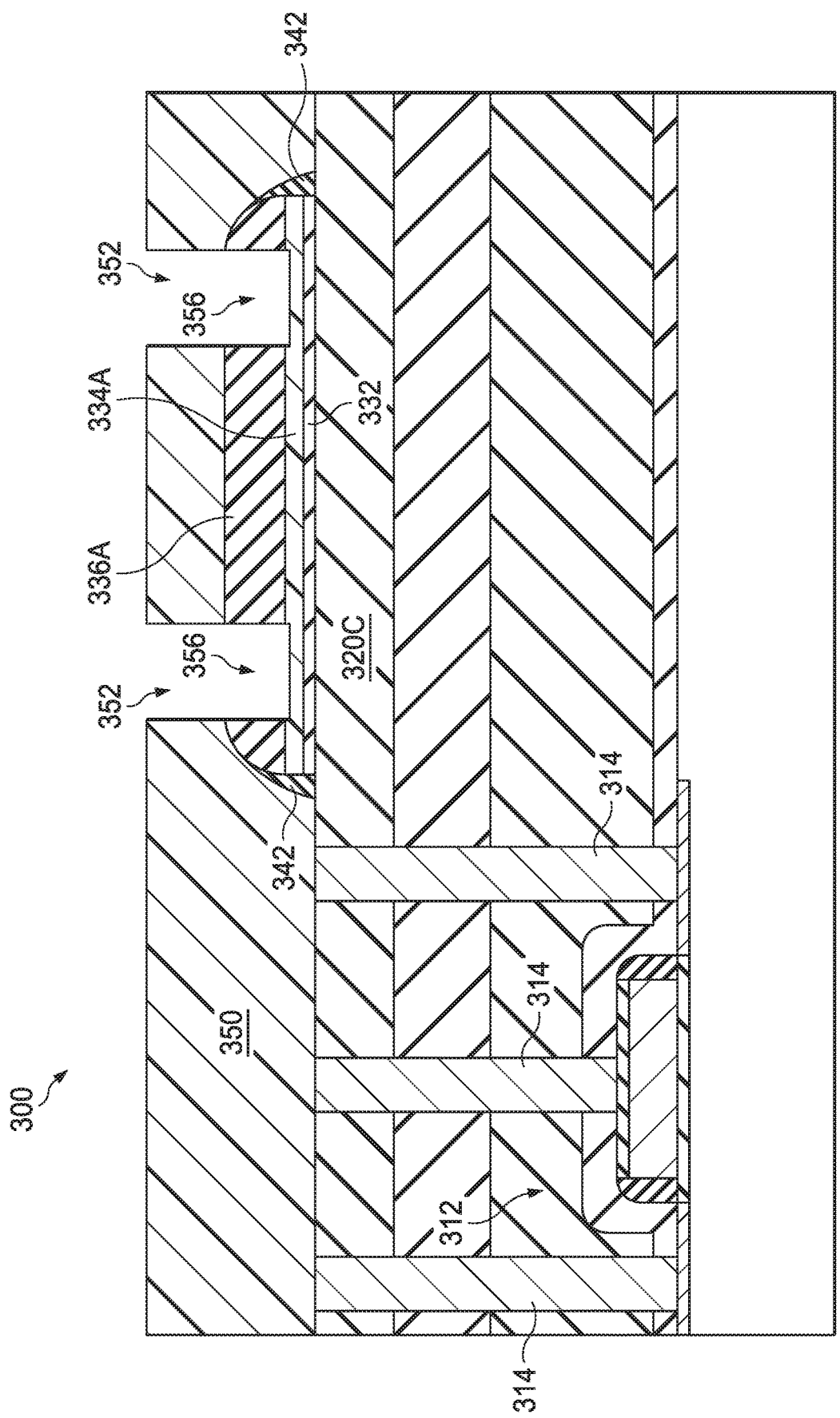

As shown in FIG. 3I, a second photomask is deposited over the structure and patterned to define a pair of mask openings aligned over the TFR element. A TFR contact etch is then performed through the mask openings 352 to define TFR contact openings 356 in the TFR oxide cap 336A, and stopping on the TFR element 334A. The TFR contact etch may be a wet etch or a dry etch. A wet etch may improve the flow of metal during a subsequent metal deposition (e.g., the Metal 1 layer deposition shown in FIG. 3K), and may reduce the occurrence of electrical shorts (often referred to as "stringers") along the TFR element 334A and between adjacent metal structures (e.g., Metal 1 layer structures).

Figure 3J:
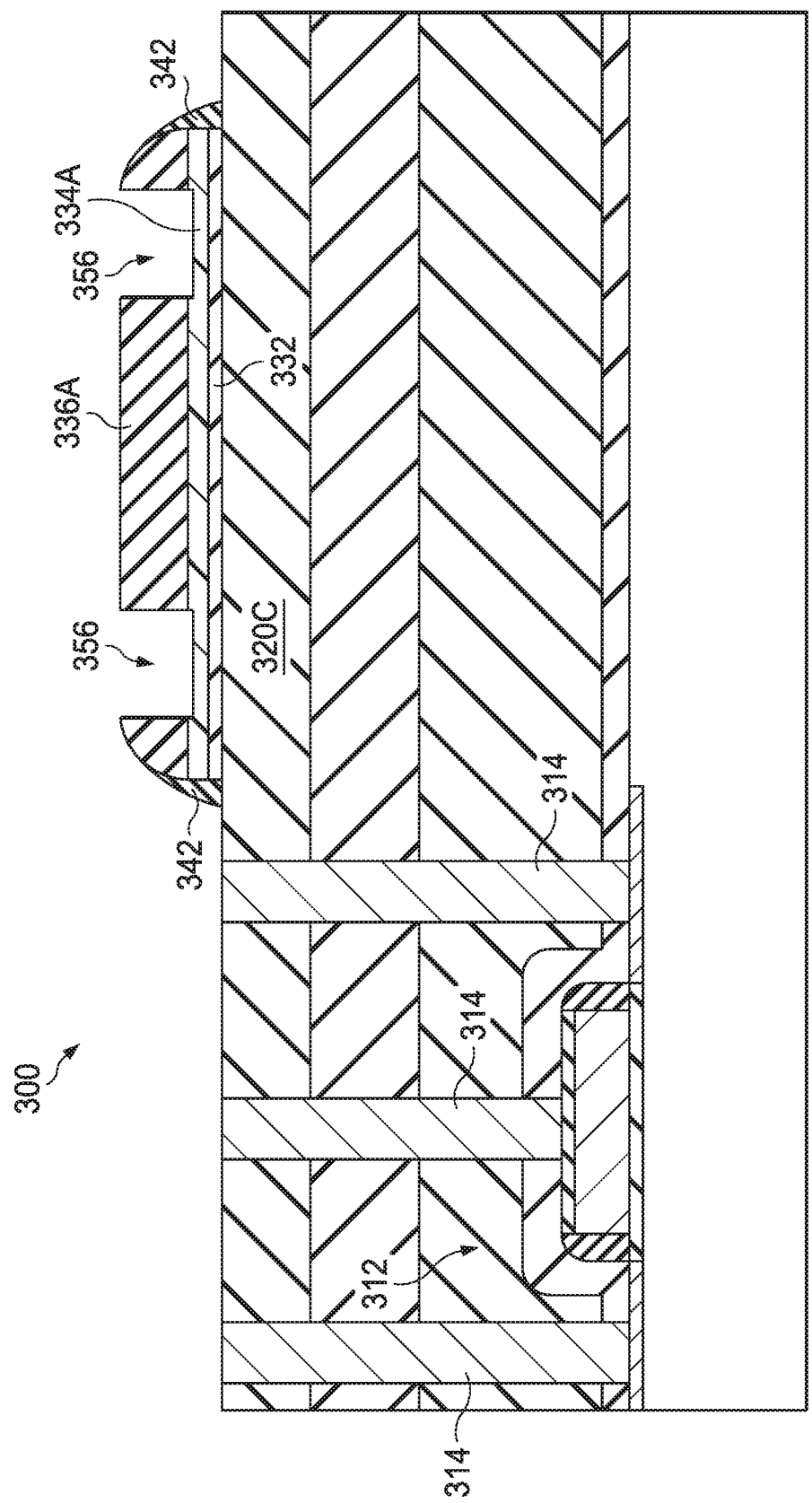

As shown in FIG. 3J, the remaining portion of the second photomask 350 may be removed, e.g., by a resist strip.

Figure 3K:
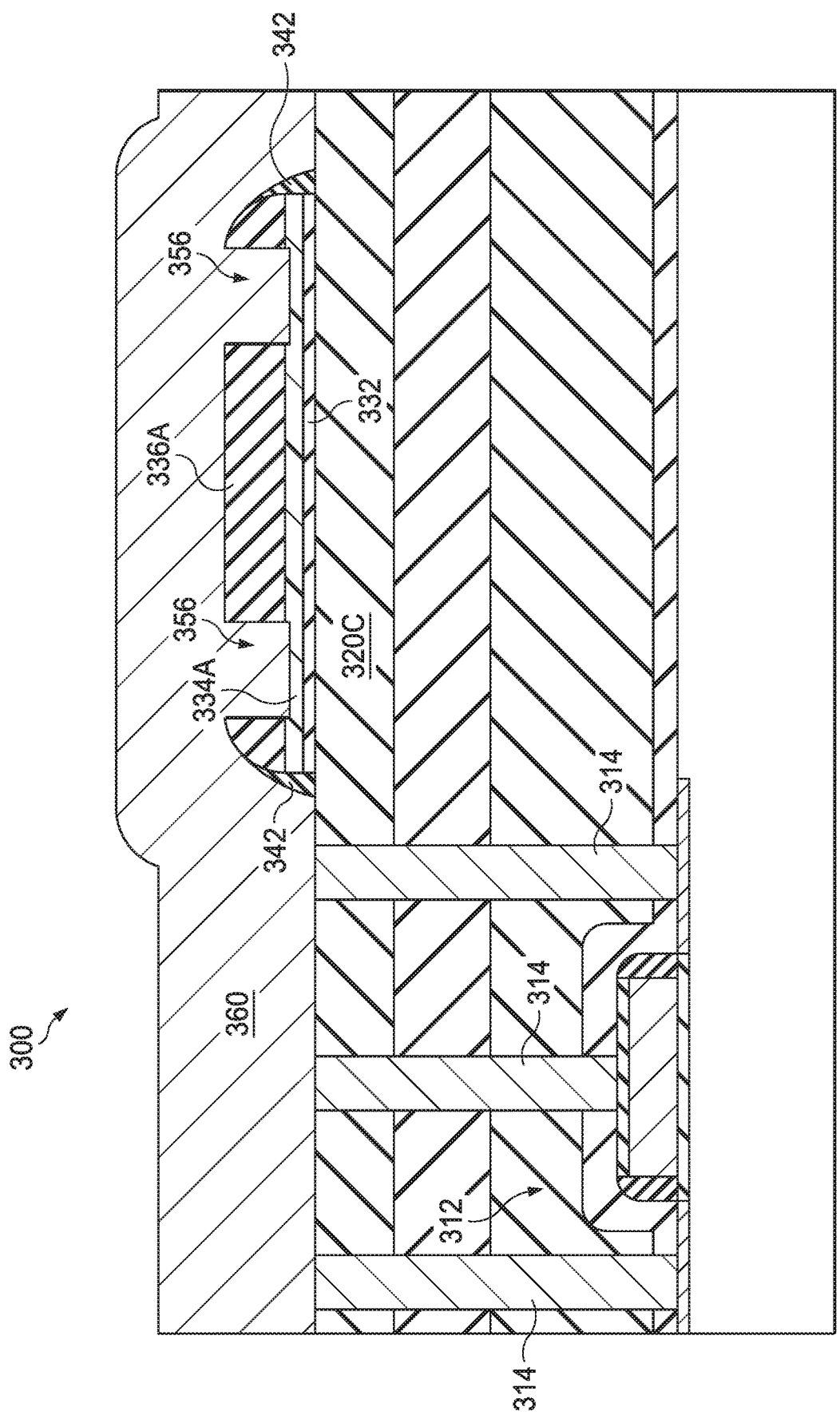

As shown in FIG. 3K, the IC device processing may continue, by forming a first metal layer/interconnect layer, referred to as a "Metal 1" layer 360. In the illustrated embodiment, Metal 1 layer 360 comprises aluminum. In other embodiments, Metal 1 layer 360 may comprise copper or other metal. As shown, Metal 1 layer 360 extends into the oxide cap openings 356 to thereby contact the TFR element 334A at opposing sides of the TFR element 334A. Metal 1 layer 360 also extends over and in contact with tungsten contacts 314.

Figure 3L:
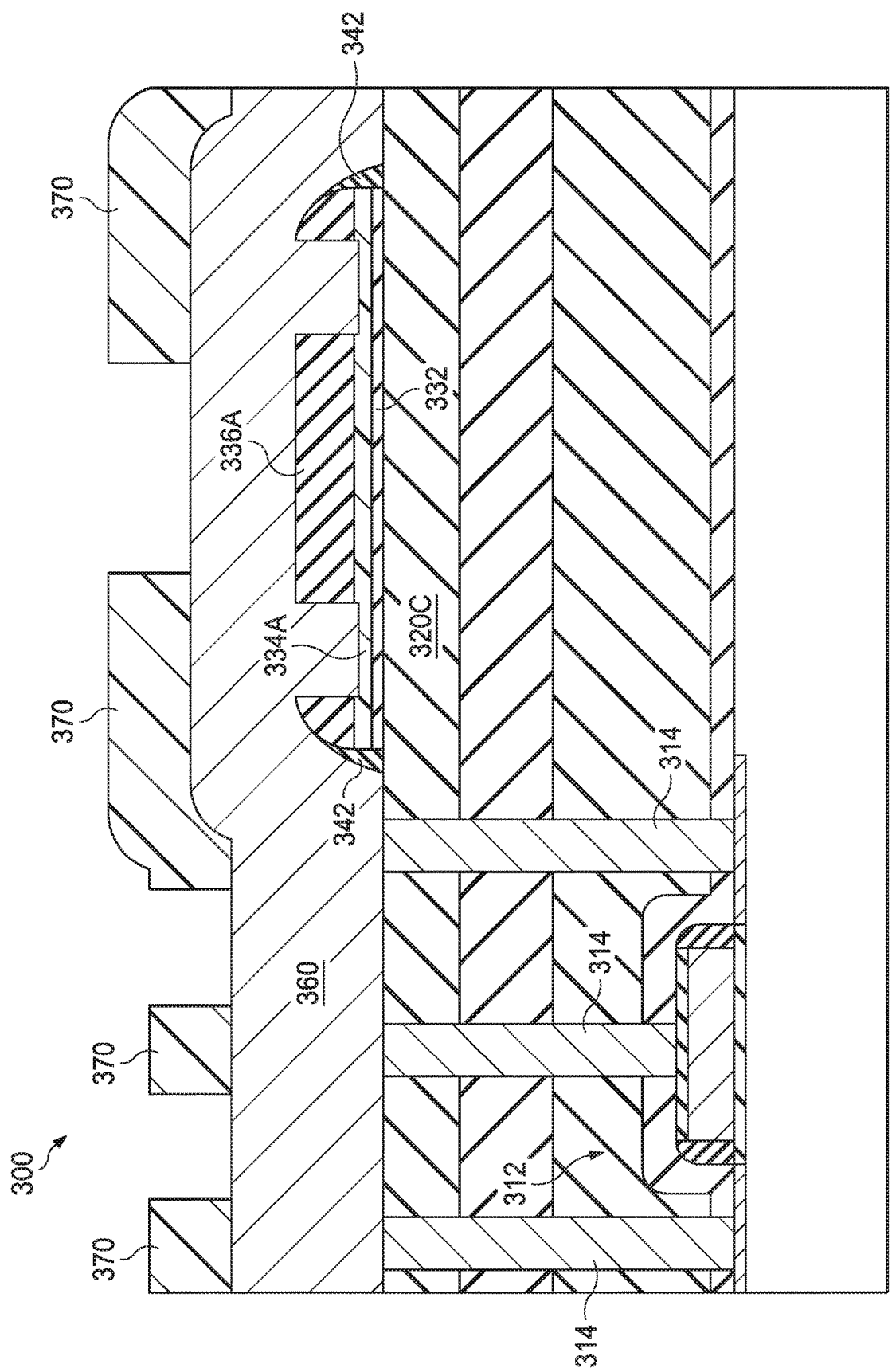

Next, as shown in FIG. 3L, a third photomask 370 may be formed and patterned over the Metal 1 layer.

Figure 3M:
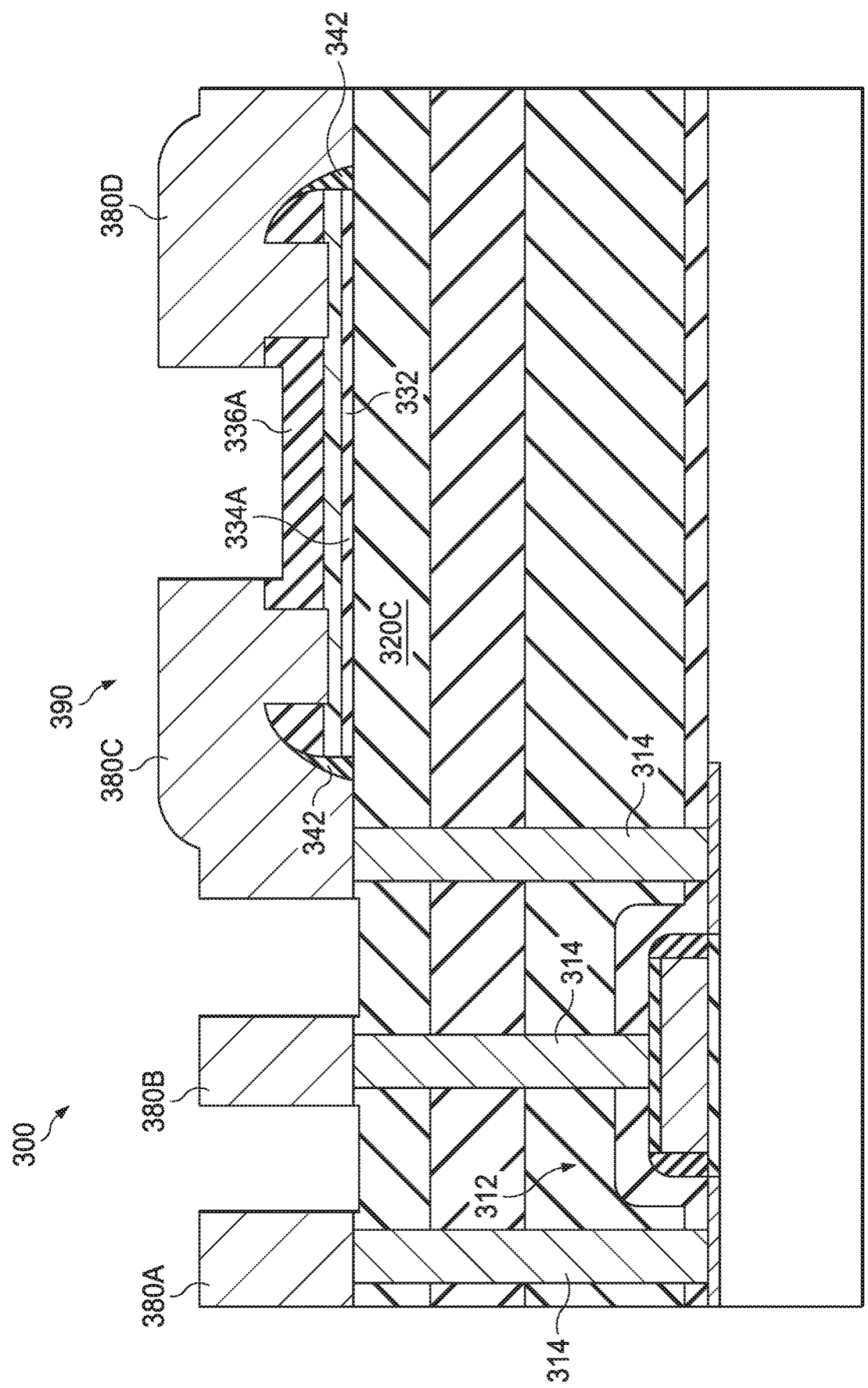

Finally, as shown in FIG. 3M, the aluminum Metal 1 layer 360 may be etched using the third photomask 370 to define a plurality of aluminum Metal 1 elements (e.g., metal interconnect elements) 380A-380D, and the remaining photoresist material 370 may then be removed. For example, as shown, the Metal 1 layer may be etched to define aluminum interconnect elements 380A and 380B in contact with tungsten vias 314, and aluminum interconnect elements 380C and 380D in contact with the opposing sides of the TFR element 334A. In this example illustration, a first aluminum interconnect element 380C conductively connects a first side of the TFR element 334A with a tungsten via 314A coupled to a source or drain region of the transistor 312, and a second interconnect element 380D conductively contacts a second side of the TFR element 334A with other IC element structure(s) (not shown). The TFR element 334A and the first and second interconnect elements 380C and 380D collectively define an integrated TFR, indicated at 390.

As shown in FIG. 3M, the TFR edge spacers 342 (e.g., SiN spacers) remain over the lateral edges 334B of the TFR element 334A, to thereby insulate the TFR element lateral edges 334B, and thereby reduce the occurrence of electrical shorts ("stringers"), as discussed above.

As discussed below, e.g., with respect to FIGS. 4A-4C and 5A-5C, the rounded and/or sloped insulating structure 344 covering the lateral edges 334B of the TFR element 334A may facilitate the removal of selected portions of the Metal 1 layer 360 adjacent selected lateral edges 334B of the TFR element 334A, e.g., to further prevent electrical shorts ("stringers") in the completed device.

Figure 4A:
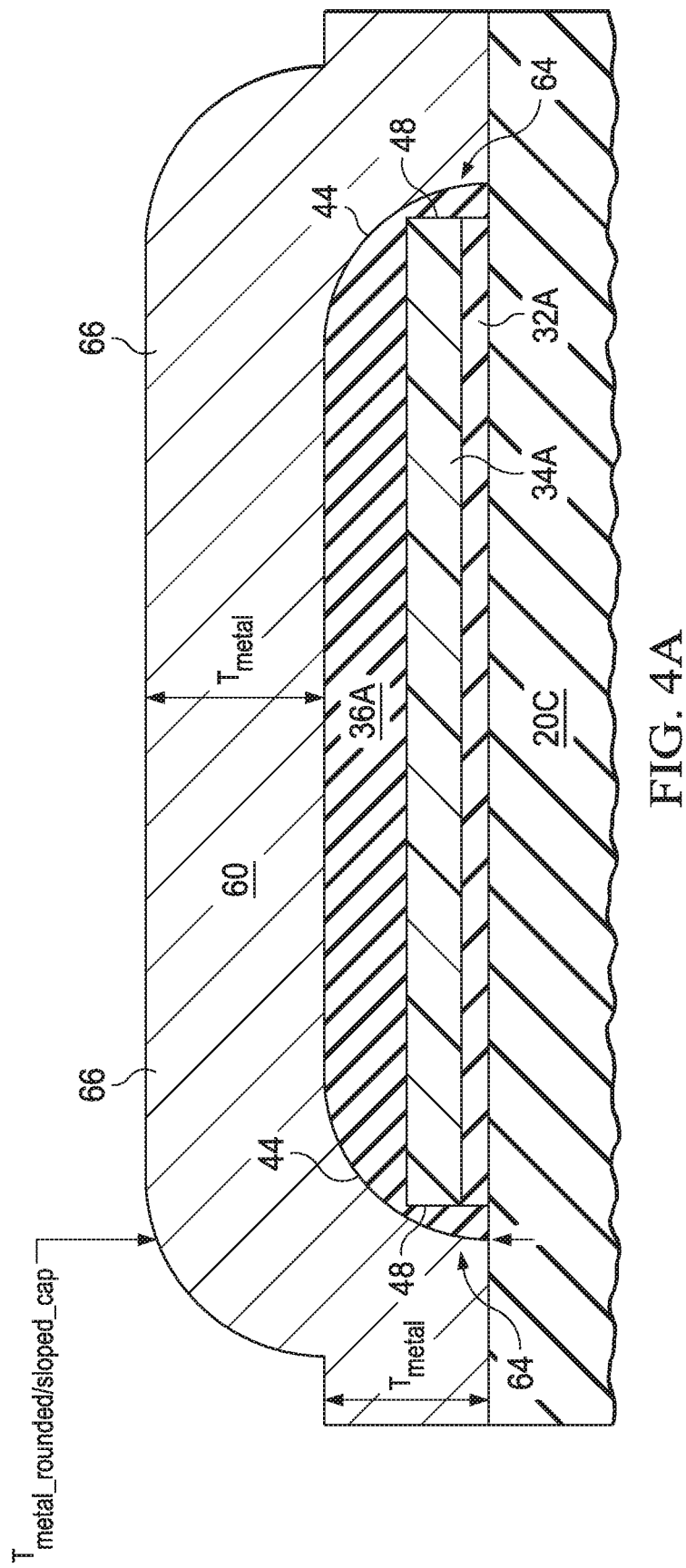
Figure 4B:
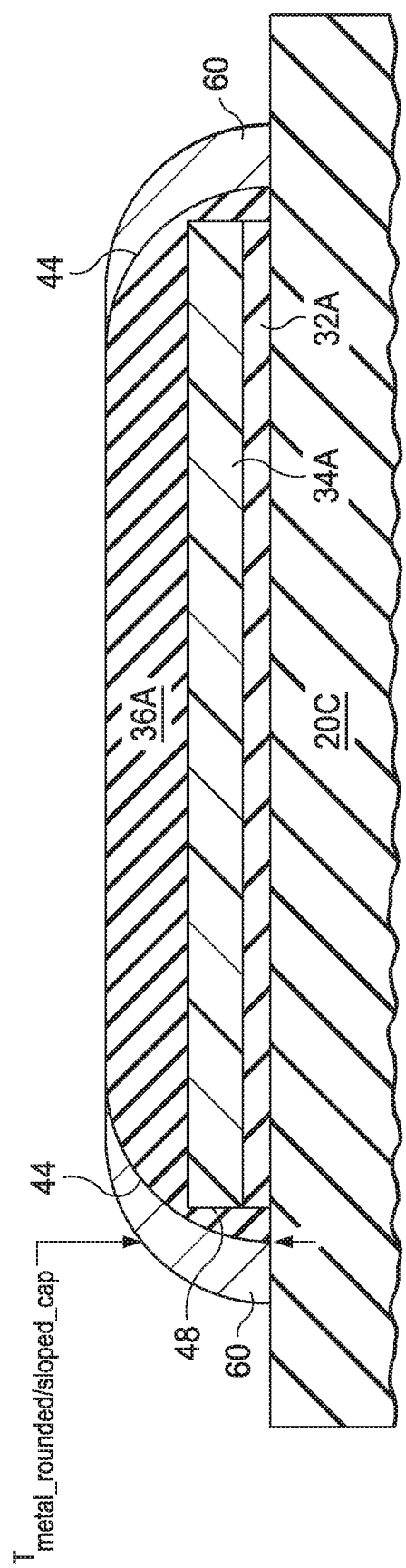
Figure 4C:
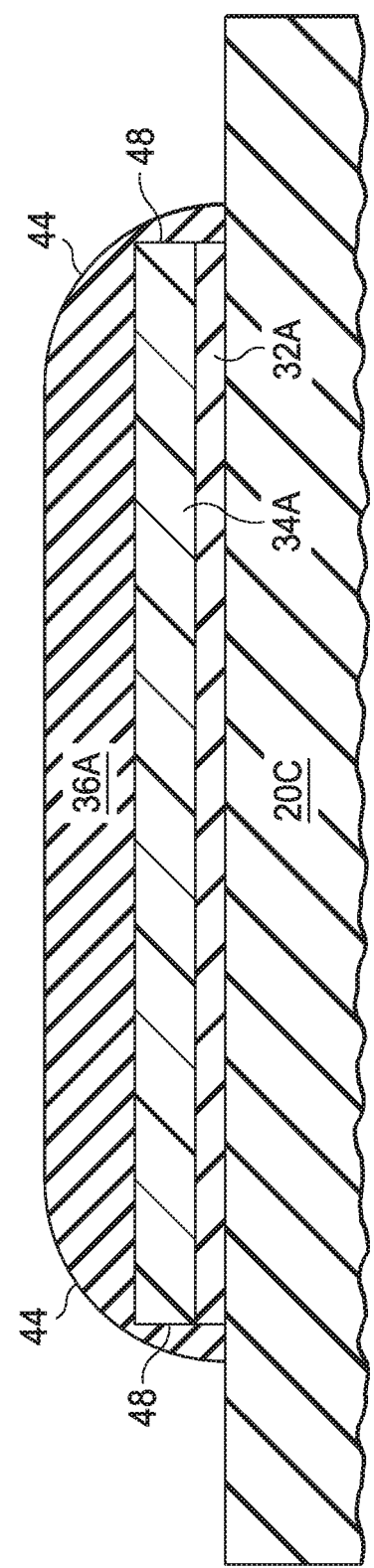
Figure 5A:
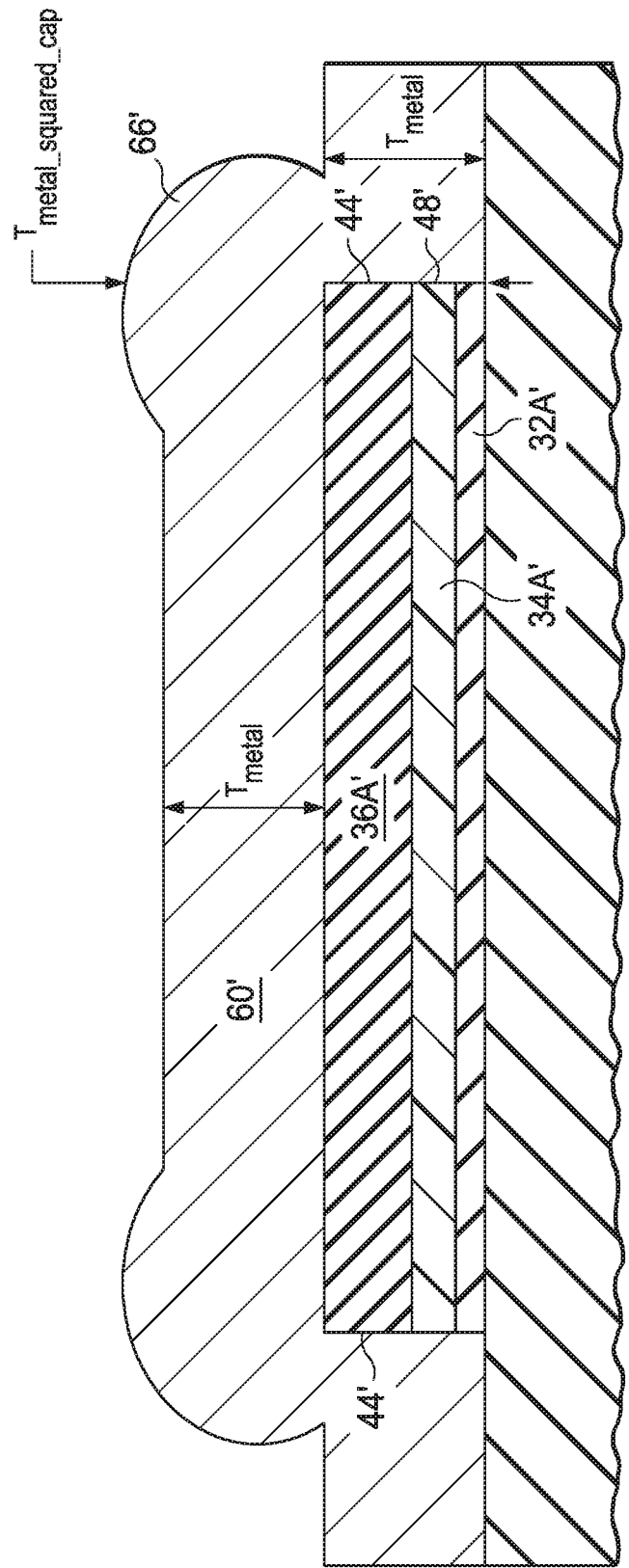

FIGS. 4A-4C and 5A-5C provide an example illustration of how the rounded and/or sloped lateral edges of the cap formed over the TFR element (e.g., the rounded upper corners 137 of the TFR oxide cap 136A in in the embodiment of FIGS. 1A-1K; the rounded/sloped edges of the TFR insulating structure 244 in the embodiment of FIGS. 2A-2M; or the rounded/sloped edges of the TFR insulating structure 344 in the embodiment of FIGS. 3A-3M) can facilitate the removal of selected portions of relevant metal layer (Metal 1 layer 160, 260, or 360) to physically separate interconnect elements from each other (e.g., elements 180C and 180D, elements 280C and 280D, or elements 380C and 380D), as compared with a similar structure having a TFR cap with vertical ("squared-off") lateral edges. FIGS. 4A-4C are cross-section views of a selected portion of an example IC structure 10 taken through a TFR element 34, in a direction perpendicular to the cross-sections shown in FIGS. 1A-1K, 2A-2M, and 3A-3M. As shown, a TFR cap 36A with rounded upper corners 44 is formed over the TFR element. In contrast, FIGS. 5A-5C are cross-section views of a selected portion of an IC structure 10' similar to IC structure 10 but having a TFR cap with vertical ("squared-off") lateral edges, as opposed to the rounded upper corners 44 of the TFR cap 36A shown in FIGS. 4A-4C.

FIGS. 4A and 5A show (a) the selected portion of IC structure 10 after deposition of a metal layer 60 over the TFR cap 36A having rounded/sloped upper corners 44 (FIG. 4A) and the selected portion of IC structure 10' after deposition of a metal layer 60' over the TFR cap 36A' having vertical lateral edges 44'. The same metal thickness, indicated as $T_{metal}$, is deposited for metal layer 60 and metal layer 60'.

FIG. 4A corresponds with a state of the IC structure after forming and patterning a photomask above the metal layer 60 and prior to a metal etch to define metal elements, e.g., elements 180A-180D shown in FIG. 1K, elements 280A-280D shown in FIG. 2M, or elements 380A-380D in FIG. 3M. In this example, the metal 60 in the illustrated cross-section should be fully removed by the metal etch in order to remove any conductive connection provided by metal 60 between the remaining metal interconnect elements, namely the metal contacts on opposing sides of the respective TFR element 34A (for example interconnect elements 180C and 18D shown in FIG. 1K, interconnect elements 280C and 280D shown in FIG. 2M, or interconnect elements 380C and 380D shown in FIG. 3M), to thereby prevent electrical shorts ("stringers") across the TFR element 34A. As shown in FIGS. 4A and 5A, the thickest portions of metal layer 60 and 60' are located adjacent the lateral edges 48 and 48' of the TFR elements 34A and 34A', indicated generally at locations 64 and 64', and thus the metal etch should be sufficient to remove the full metal thickness in these locations. As explained below, the rounded/sloped upper corners 44 of the TFR cap 36A reduce the metal thickness in these locations, thus reducing the required metal etch parameter(s), e.g., etching time or etching intensity.

Metal layers 60 and 60' shown in FIGS. 4A and 5A may each comprise an aluminum layer, e.g., Al, AlCu, and AlSiCu, applied as a sputtered film. As know in the art, physical sputtered films such as Al, AlCu, and AlSiCu are typically not fully conformal. "Bread-loafing" occurs above the upper corners of physical structures, e.g., as shown in FIG. 4A at 66, and in FIG. 5A at 66'. As shown, the rounded/sloped TFR cap corners 44 shown in FIG. 4A reduce the extent of "bread-loafing" at the upper corners, as compared with the vertical TFR cap edges 44' shown in FIG. 5A. This reduced "bread-loafing" effect, along with the rounded contour of metal layer 60 over the rounded/sloped TFR cap corners 44, results in a vertical metal thickness $T_{metal\_rounded/sloped\_cap}$ adjacent the lateral edges 48 of the TFR element 34A (i.e., at locations 64 shown in FIG. 4), that is less than a vertical metal thickness $T_{metal\_squared\_cap}$ adjacent the lateral edges 48' of the TFR element 34A' of IC structure 10' (i.e., at locations 64' shown in FIG. 5). Thus, viewing $T_{metal\_rounded/sloped\_cap}$ in comparison to the lesser $T_{metal\_squared\_cap}$, it can be seen that the maximum vertical thickness of metal to be removed during the metal etch (to prevent electrical shorts across the TFR element 34A or 34A') is reduced as a result of the rounded/sloped TFR cap corners 44, as compared with vertical TFR cap edges 44'.

FIGS. 4B and 5B show the selected portions of IC structure 10 and IC structure 10' during the metal etch to remove each metal layer 60 and 60'. In particular, FIGS. 4B and 5B shows a state during the etch at which the horizontal regions of each metal layer 60 and 60', each having thickness $T_{metal}$, have been removed, while regions of metal layers 60 and 60' at the lateral edges 48, 48' of each TFR element 34A, 34A' still remain. As shown, the maximum remaining metal thickness $T_{metal\_rounded/sloped\_cap}$ in the structure having rounded/sloped TFR cap corners 44 (FIG. 4B), is smaller than the maximum remaining metal thickness $T_{metal\_squared\_cap}$ in the structure having squared TFR cap edges 44' (FIG. 5B), and thus requires a shorter etch time (or etch intensity) to remove fully.

FIGS. 4C and 5C show the selected portions of IC structure 10 and IC structure 10' after additional etch time (over etch), in particular at a time at which the thickest regions of metal layer 60 (at $T_{metal\_rounded/sloped\_cap}$) have been fully removed. As shown, in the structure having squared TFR cap edges 44' (FIG. 5C), a thickness of metal 60' (indicated at $T_{metal\_squared\_cap}$) still remains at the time when the metal layer 60 in IC structure 10 (FIG. 4C) has been fully removed. Thus, the rounded/sloped TFR cap corners 44 formed in IC structure 10 may reduce the etch time (or etch intensity) required to fully remove the metal 60 to prevent electrical shorts across the TFR element 34A. The reduced etch time (or etch intensity) allows for a thinner photoresist, which allows for tighter metal line spacing in IC structure 10, e.g., as compared with an IC structure using squared TFR cap edges 44' (FIGS. 5A-5C). This reduction in metal line spacing may allow for an overall reduction in the size of IC structure 10, which may allow for more IC devices per wafer, which may reduce the cost per device.

Although the disclosed embodiments are described in detail in the present disclosure, it should be understood that various changes, substitutions and alterations can be made to the embodiments without departing from their spirit and scope.

The invention claimed is:

1. A method of forming an integrated thin film resistor (TFR) in a semiconductor integrated circuit device, the method comprising:
   forming an integrated circuit (IC) structure including a plurality of IC elements and a plurality of conductive IC element contacts connected to the plurality of IC elements;
   forming an etch stop layer over the IC structure;
   forming a TFR film layer over the etch stop layer;
   annealing the TFR film layer to form an annealed TFR film layer;
   forming a TFR oxide cap layer over the annealed TFR film layer;
   forming and patterning a photomask over the TFR oxide cap layer;
   performing an oxide cap etch process to remove selected portions of the TFR oxide cap layer to define a TFR oxide cap, wherein the oxide cap etch process stops at the annealed TFR film layer;

removing the photomask;

after removing the photomask, performing a TFR etch process to remove selected portions of the annealed TFR film layer to define a TFR element, wherein the TFR etch process stops at the etch stop layer;

after the TFR etch process, performing an etch stop layer etch process to remove selected portions of the etch stop layer, wherein the TFR oxide cap acts as a hardmask for the TFR etch process and for the etch stop layer etch process;

performing a TFR contact opening etch process to form at least one TFR contact opening in the TFR oxide cap, thereby exposing at least one surface area of the TFR element; and forming a metal interconnect layer over the IC structure and including (a) at least one metal interconnect element coupled to at least one of the plurality of conductive IC element contacts and (b) at least one metal interconnect extending into the at least one TFR contact opening to contact the underlying TFR element.

2. The method of claim 1, comprising:
forming the TFR film layer directly on the etch stop layer.

3. The method of claim 1, wherein the integrated circuit structure includes a memory cell or transistor structure including at least one conductive IC element contact connected to at least one of a source region, a drain region, and a gate region of the memory cell or transistor structure.

4. The method of claim 1, wherein the TFR film layer comprises silicon carbide chromium (SiCCr), silicon chromium (SiCr), chromium silicon nitride (CrSiN), tantalum nitride (TaN), tantalum silicide (Ta$_2$Si), or titanium nitride (TiN).

5. The method of claim 1, wherein the metal interconnect layer comprises aluminum.

6. The method of claim 1, wherein the TFR anneal comprises an anneal at a temperature of at least 500° C.

7. The method of claim 1, wherein the TFR anneal comprises an anneal at a temperature of 515° C.±10° C. for a duration of 15-60 minutes.

8. The method of claim 1, wherein the TFR contact etch process comprises a wet etch.

9. The method of claim 1, wherein forming the metal interconnect layer includes forming a particular metal interconnect element defining a conductive connection between the TFR element and at least one of the plurality of conductive IC element contacts.

10. A method of forming an integrated thin film resistor (TFR) in a semiconductor integrated circuit device, the method comprising:

forming an integrated circuit (IC) structure including a plurality of IC elements and a plurality of conductive IC element contacts connected to the plurality of IC elements;

forming an etch stop layer over the IC structure;

forming a TFR film layer over the etch stop layer;

annealing the TFR film layer to form an annealed TFR film layer;

forming a TFR oxide cap layer over the annealed TFR film layer;

forming and patterning a photomask over the TFR oxide cap layer;

performing an oxide cap etch process to remove selected portions of the TFR oxide cap layer to define a TFR oxide cap, wherein the oxide cap etch process stops at the annealed TFR film layer;

removing the photomask;

after removing the photomask, performing at least one etch process, using the TFR oxide cap as a hardmask, to (a) remove selected portions of the annealed TFR film layer not covered by the TFR oxide cap to define a TFR element and (b) remove selected portions of the etch stop layer not covered by the TFR oxide cap;

forming a spacer layer over the TFR oxide cap;

performing a spacer etch process to remove first portions of the spacer layer but leaving second portions of the spacer layer that define TFR edge spacers at lateral edges of the TFR element;

performing a TFR contact opening etch process to form at least one TFR contact opening in the TFR oxide cap, thereby exposing at least one surface area of the TFR element; and forming a metal interconnect layer over the IC structure and including (a) at least one metal interconnect element coupled to at least one of the plurality of conductive IC element contacts and (b) at least one metal interconnect extending into the at least one TFR contact opening to contact the underlying TFR element.

11. The method of claim 10, wherein the spacer layer comprises an oxide spacer layer.

12. The method of claim 10, wherein the spacer layer comprises a nitride spacer layer.

13. The method of claim 10, wherein each TFR edge spacer has a rounded, non-vertical outer sidewall that reduces the likelihood of electrical shorts associated with the TFR element.

14. The method of claim 10, wherein the integrated circuit structure includes a memory cell or transistor structure including at least one conductive IC element contact connected to at least one of a source region, a drain region, and a gate region of the memory cell or transistor structure.

15. The method of claim 10, wherein the TFR film layer comprises silicon carbide chromium (SiCCr), silicon chromium (SiCr), chromium silicon nitride (CrSiN), tantalum nitride (TaN), tantalum silicide (Ta$_2$Si), or titanium nitride (TiN).

16. The method of claim 10, wherein the metal interconnect layer comprises aluminum.

17. A method of forming an integrated thin film resistor (TFR) in a semiconductor integrated circuit device, the method comprising:

forming an integrated circuit (IC) structure including a plurality of IC elements and a plurality of conductive IC element contacts connected to the plurality of IC elements;

forming a TFR film layer over the IC structure;

annealing the TFR film layer to produce an annealed TFR film layer;

forming a TFR oxide cap layer over the annealed TFR film layer;

performing an oxide cap etch process to remove selected portions of the TFR oxide cap layer to define a TFR oxide cap, wherein the oxide cap etch process stops at the annealed TFR film layer;

performing a TFR etch process, using the defined TFR oxide cap as a hardmask, to remove selected portions of the annealed TFR film layer to define a TFR element;

forming an oxide spacer layer over the defined TFR oxide cap;

performing a spacer etch process to remove first portions of the oxide spacer layer but leaving second portions of the oxide spacer layer that define TFR edge spacers at lateral edges of the TFR element;

performing a TFR contact opening etch process to form at least one TFR contact opening in the defined TFR oxide cap, thereby exposing at least one surface area of the TFR element; and forming a metal interconnect layer over the IC structure and including (a) at least one metal interconnect element coupled to at least one of the plurality of conductive IC element contacts and (b) at least one metal interconnect extending into the at least one TFR contact opening to contact the underlying TFR element.

* * * * *